(12) United States Patent
Coffey et al.

(10) Patent No.: US 6,492,929 B1
(45) Date of Patent: Dec. 10, 2002

(54) ANALOGUE TO DIGITAL CONVERTER AND METHOD OF ANALOGUE TO DIGITAL CONVERSION WITH NON-UNIFORM SAMPLING

(75) Inventors: Adrian S Coffey, Malvern (GB); Martin Johnson, Malvern (GB); Robin Jones, Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/856,312

(22) PCT Filed: Dec. 17, 1999

(86) PCT No.: PCT/GB99/04289

§ 371 (c)(1),
(2), (4) Date: May 21, 2001

(87) PCT Pub. No.: WO00/38325

PCT Pub. Date: Jun. 29, 2000

(30) Foreign Application Priority Data

Dec. 19, 1998 (GB) ............................................. 9827932

(51) Int. Cl.[7] ................................................. H03M 1/12
(52) U.S. Cl. .................... 341/155; 341/118; 341/120; 341/123; 341/127; 341/128; 341/129; 341/156
(58) Field of Search ............................ 341/123.1, 155, 341/126–127, 128, 129, 156

(56) References Cited

U.S. PATENT DOCUMENTS

| 3,838,413 | A | * | 9/1974 | Wehrmann | ................... 341/170 |
| 4,291,299 | A | | 9/1981 | Hinz et al. | |
| 4,353,059 | A | * | 10/1982 | Vaitkus | ....................... 341/156 |
| 4,429,332 | A | * | 1/1984 | Pargee, Jr. | ................... 348/482 |
| 5,831,568 | A | * | 11/1998 | Mohr | .......................... 341/120 |
| 5,920,274 | A | * | 7/1999 | Gowda et al. | .............. 341/155 |
| 5,945,934 | A | * | 8/1999 | De Los Santos | ............ 341/120 |
| 6,020,840 | A | * | 2/2000 | Ong | ............................ 341/155 |

FOREIGN PATENT DOCUMENTS

| EP | 0 540 763 | 5/1993 |
| GB | 2 179 516 | 3/1987 |
| WO | WO99/34572 | 7/1999 |

OTHER PUBLICATIONS

R. Greenhalgh: "Analog–to–Digital Converter System" IBM Technical Disclosure Bulletin., vol. 7, No. 9, Feb. 1965, p. 763, IBM Corp. New York., US.

* cited by examiner

*Primary Examiner*—Michael Tokar
*Assistant Examiner*—Linh Van Nguyen
(74) *Attorney, Agent, or Firm*—Nixon & Vanderhye P.C.

(57) ABSTRACT

An analogue to digital converter generating at least two threshold levels and a comparator for comparing each of the levels with the input signal and generating a primary digital output signal to provide an indication that the input signal has crossed one of the threshold levels. The converter comprises a timer for determining the elapsed period of time between the input signal crossing a first level and the input signal crossing a second level and for generating a secondary output signal representing the elapsed time, whereby the secondary digital output signal and the corresponding primary output signal are used to provide a digital representation of the analogue input signal. The converter may also comprise a receiver of the primary digital output signal from the comparator and for providing an UP/DOWN digital output signal to indicate in which direction the input signal crossed the threshold level.

33 Claims, 12 Drawing Sheets

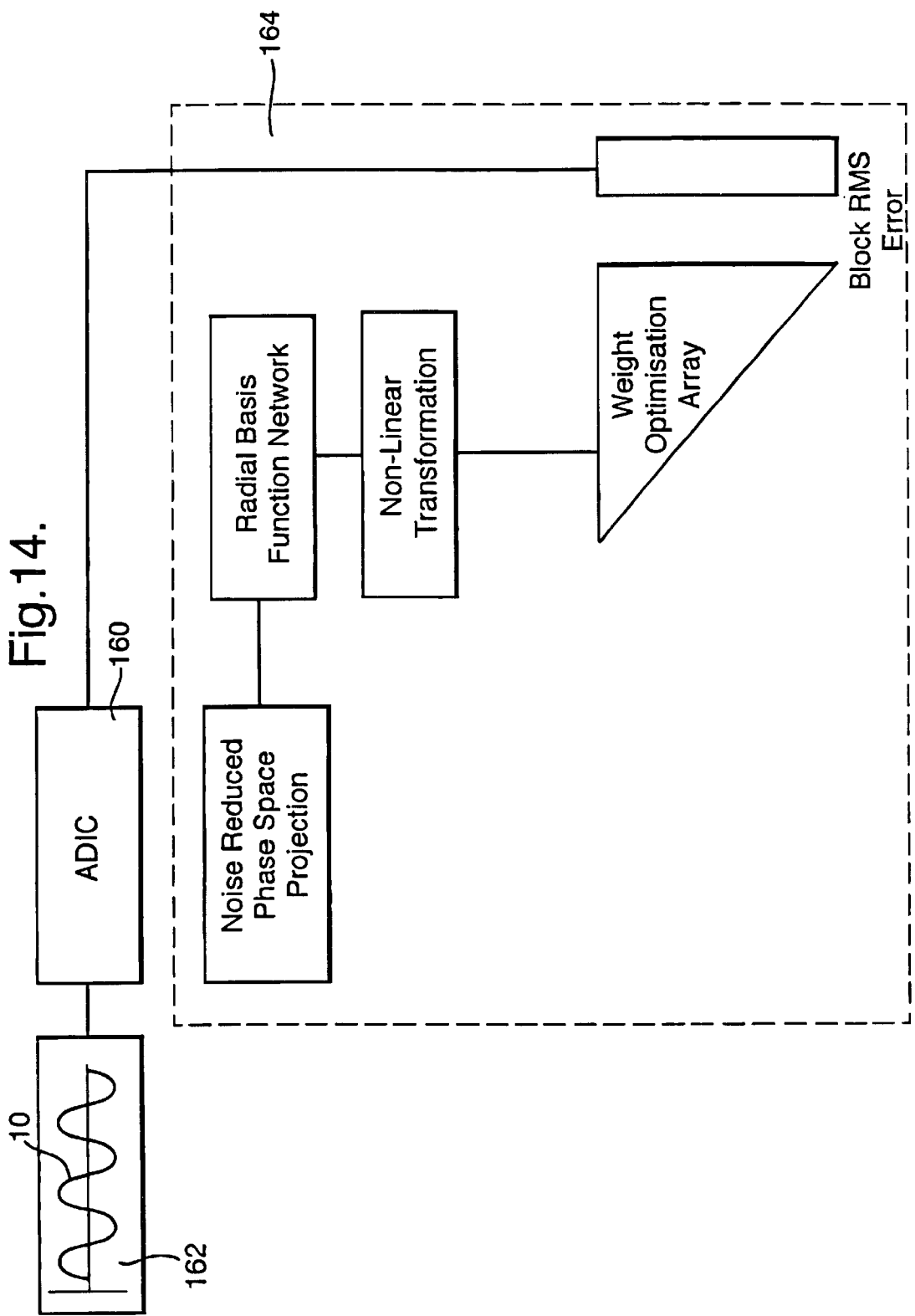

ANALOGUE TO DIGITAL CONVERTER AND METHOD OF ANALOGUE TO DIGITAL CONVERSION WITH NON-UNIFORM SAMPLING

BACKGROUND OF THE INVENTION

1. Field of the Invention

The invention relates to a method and apparatus for converting an analogue input signal into a digital representation. In particular, the invention relates to an apparatus for providing a digital representation of an analogue signal having characteristics advantageous for waveform matching and prediction.

2. Discussion of Prior Art

Analogue to Digital Converters (ADCs) enable an analogue input signal to be converted into a digital representation of the input signal which preserves information contained in the input signal. In the simplest ADC form, the zero-crossing discriminator, the output changes from a logical naught to a logical one when the input voltage crosses a reference voltage of zero volts. The input signal is transformed into a hard-limited telegraph function [D. Middleton and J. H. Van Vleck, IEEE, 54, 1 (1966)]; a simple sequence of naughts and ones. The spectral information contained in the input signal is also contained in the telegraph function, subject to a scaling factor, because the spectral information in the output digital representation is principally carried in the time intervals between the zero-crossings.

More sophisticated ADCs comprise a number of threshold-crossing discriminators each with its own reference voltage, where adjacent reference voltages are spaced apart by a common amount. For example, the outputs of sixteen discriminators expressed as a binary code would indicate that the input voltage lay somewhere between two particular reference voltages. However, for any significant amount of noise at the input, the input signal cannot be considered static during the conversion processes, causing the output digital representation to change rapidly and be almost indeterminate. To overcome this problem the input signal is held constant using a "track and hold" circuit and the resulting unambiguous output digital representation during the "hold" phase is latched into a register by sample pulses which occur at equally spaced intervals of time. At the same time, the output digital representation may be made more compact.

Analogue to digital conversion methods in which the input analogue signal is periodically sampled at a predetermined constant rate and each sampled value is converted into a corresponding digital representation are standard. To convert analogue signals having high frequency components, a higher sampling rate must be used, resulting in an increased amount of output digital information. Furthermore, the high sampling rate results in an increased amount of unnecessary digital information for sections of the analogue input which have a relatively low frequency. For analogue signals having both high and low frequency components, a low sampling rate is not appropriate as the high frequency components cannot then be correctly identified. Conventionally, the choice of regular sampling rate is subject to the well known "Nyquist sampling criterion".

Furthermore, constant sampling rate analogue to digital conversion techniques are not particularly suitable for waveform matching and time series recognition applications. By sampling an analogue input amplitude at a fixed rate, two similar signals evolving in two different timescales, such as a car engine running at two different speeds, will give rise to two different output digital representations. Even though the two signals originate from the same source, the two different output digital representations will not be recognised as such due to the different timescales with which the input signals evolve.

In time series recognition applications, the analysis of data in the time domain may be used to extract information from a single channel sensor. A time series may be used to construct a trajectory evolving through multi-dimensional phase space which evolves with time over the surface of a geometrical object. The comparison of one such geometrical object, in particular a standard one, with a measured one provides a comparison of the state of one physical system with another. U.S. Pat. No. 5,835,682 describes a Heuristic processor which computes a multi-dimensional, nonlinear, predictive model constrained to predict the next sample of the time series from which it was calculated. The input data to the Heuristic processor are digital representations of analogue source signals for which conventional uniform sampling rate ADCs are employed. However, the use of uniform sampling rate analogue to digital converters has the inherent problem of introducing inaccuracies in the comparison of the predicted to measured time series. This degrades the temporal dependence and therefore has limitations when used for time series recognition applications.

The foundations of a general theory for randomised signal processing are discussed by I. Bihnskis and A. Mikelsons in "Randomised Signal Processing" (1992, Prentice Hall) which exemplifies the problems and benefits associated with some methods for processing signals subjected to non uniform sampling in time. The theory of non-uniform sampling for the digital encoding of analogue sources has previously been proposed as a means for data compression [*IEEE Transactions on Communications, Vol. COM*-29, *No*.1, January 1981 pp.24–32]. In the scheme proposed in this paper, information about an analogue source signal is contained in a digital representation of the time intervals between the crossing of the input analogue signal and any of the number of fixed threshold levels and in the direction of the threshold level crossing (up or down). The scheme is disadvantageous in that the digital representation is not compact and represents the interval between threshold crossings as pairs of zeros output at a regular rate. The pairs of zeros are interspersed with a 2-digit binary code representing direction.

Another sampling technique for analogue to digital conversion is described in IEEE Transactions on Circuits and Systems—II: Analogue and Digital Signal Processing, Vol. 43, No. 4, April 1996. In this case, the final aim of the technique is to generate samples of the input signal that are uniformly spaced in time. This is done by recording the time instants at which the signal crosses any of the predetermined, fixed, quantisation levels, together with the specific quantisation level information, thus forming an output sequence consisting of "amplitude-time" ordered pairs. This forms a local reconstruction of the signal which is then re-sampled by interpolation to provide equal interval amplitude samples. Once again, a non-compact sequence of ordered pairs is used to represent the input signal.

U.S. Pat. No. 4,291,299 describes a non-uniform sampling analogue to digital converter for converting analogue signals with large, short-term amplitude excursions. Such signals typically occur on telephone lines affected by lightning strikes or from power system faults. The sampling is non-uniform in both time and amplitude. Before the signal is sampled, multiple predetermined, absolute voltage levels are set as threshold levels. The system samples an input analogue signal and, whenever the input signal or the difference signal between the analogue signal and its last preceding sample, crosses any of the multiple predetermined levels this is detected and a digital code representing the particular level crossed is output This digital code forms part of an output digital word which also comprises a timer circuit count representing the time which has elapsed since the preceding sample occurred An alternative analogue to digital converter system is described by R. Greenhalgh (IBM Technical disclosure bulletin, Vol. 7, no. 9, February 1965 (1965-02)). This document describes a system in which threshold levels are set at A±(ΔA/2), where A is an analogue representation of the digital value stored in a register. If the input signal crosses one of the thresholds the register is reset to the value of the threshold that has been crossed, and a digital signal is output from the system which contains a digital representation of the value stored in the register and a digital representation of the absolute time value of the clock. Alternatively, the direction of the change in amplitude, as indicated by the tick register, is recorded instead of the absolute voltage.

GB2179516 is concerned with sampling an analogue waveform at a frequency significantly greater than the Nyquist frequency. Simple averaging of such an oversampled waveform to produce a waveform at the required sampling rate increases the dynamic range of A–D conversion. However, the method of GB 2179516 increases the dynamic range further by describing the analogue waveform as a mathematical function, from which a digital representation can be output at a desired sampling rate.

It is an object of the present invention to provide a method and apparatus for converting an analogue input signal into a digital representation which overcomes the problems arising from the temporal dependence inherent in constant sampling rate analogue to digital converters. It is a further object of the invention to provide a technique and apparatus for analogue to digital conversion which provides an output digital representation in compact form from which the original input analogue signal can be substantially reconstructed.

For the purpose of this specification, the term 'analogue to digital converter' shall be taken to mean a device for converting an analogue signal into a digital representation by sampling the input signal at a substantially constant rate. The term 'analogue to digital interval converter' shall be taken to mean a device for converting an analogue signal into a digital representation by sampling the input signal at substantially equal changes in amplitude. The term 'time series' shall be taken to refer to a sequence of amplitude values generated as a result of sampling an analogue input signal converted with small uncertainties in amplitude, as in a conventional ADC. The term 'time sequence' shall be taken to refer to a sequence of time interval values generated as a result of sampling an analogue input signal converted with small uncertainties in time interval.

SUMMARY OF THE INVENTION

According to one aspect of the present invention, an analogue to digital converter for converting an analogue input signal into a digital representation includes;

generation means for generating at least two threshold levels for comparison with the analogue input signal, comparison means for comparing each of the threshold levels with the input signal and for generating a primary digital output signal to provide an indication that the input signal has crossed one of the threshold levels, timing means, characterised in that, the elapsed period of time between the input signal crossing a first threshold level and the input signal crossing a second threshold level at a later time is determined by the timing means and a secondary digital output signal representing the elapsed period of time is also generated by the timing means, the secondary digital output signal and the corresponding primary digital output signal being used to provide a digital representation of the analogue input signal.

In a preferred embodiment, the converter also comprises means for receiving the primary digital output signal from the comparison means and for providing an UP/DOWN digital output signal to indicate in which direction, UP or DOWN, the input signal crossed the threshold level, whereby the secondary digital output signals and the associated UP/DOWN digital output signal constitute a digital representation of the analogue input signal.

This provides the advantage that the output from the converter is series of signed, time interval values i.e. a digital representation comprising a series a time interval values having an UP or DOWN (+ or −) sign attached. The output from the converter can therefore be made compact. This is particularly advantageous for input signals which vary slowly with time. Using a conventional analogue to digital converter, which samples at a constant rate, results in a large amount of output data as the low frequency portions of the input signal are oversampled The present invention alleviates this problem as the sampling rate is determined by the local rate of change of the input signal.

Conveniently, the digital representation may be expressed as a 2's complement number for subsequent input to a computer.

In addition, the analogue to digital interval conversion techniques proposed in the prior art provide a non-compact data output. The present invention is advantageous in that the digital output signal is a compact sequence of time interval values having an UP or DOWN flag attached (+ or −) to indicate the direction of threshold level change for a given time interval.

The comparison means may comprise means for comparing each of the threshold levels with the input signal or, alternatively, means for comparing each of the threshold levels with a signal derived from the input signal.

In a further preferred embodiment, the generation means include adjustment means for adjusting the threshold levels relative to the input signal in response to a threshold level crossing. This provides the advantage that only two threshold levels need be used as they can be made to track the input signal as it evolves in time.

In one embodiment of the invention, the adjustment means may comprise means for adjusting the threshold levels themselves in response to a threshold level crossing.

In this embodiment, the comparison means may comprise two comparators, each receiving the input signal and a different one of two threshold levels, UPPER or LOWER, forming an amplitude window about the current input signal, whereby if the input signal crosses one of the threshold levels the corresponding comparator generates a primary digital output signal to a subsequent logic stage for generating the UP/DOWN digital output signal.

In addition, the generation means may comprise two digital to analogue, each for generating a different one of the two threshold levels, UPPER or LOWER, for input to the associated comparator, whereby the digital to analogue converters each receive a digital input determined by the direction of the UP/DOWN digital output signal generated by the preceding threshold level crossing.

The digital to analogue converters may receive the digital inputs via counter means which serve to increasingly or decreasingly adjust the threshold levels accordingly in response to the UP/DOWN digital output signal generated by the preceding threshold level crossing.

Alternatively, the digital to analogue converters may receive the digital inputs from a logic circuit which serves to increasingly or decreasingly adjust the threshold levels accordingly in response to the UP/DOWN digital output signal generated by the preceding threshold level crossing.

Preferably, following each threshold crossing, the threshold levels are substantially equal to $V_{REF}+\Delta V$ and $V_{REF}-\Delta V$, where $V_{REF}$ is the value of the analogue input signal as the threshold level crossing occurs and $\Delta V$ is a pre-set threshold voltage.

Alternatively, instead of adjusting the threshold levels themselves, the signal derived from the input signal may be adjusted in response to the derived signal crossing a threshold level.

For example, the converter may comprise, sample and hold means for sampling the analogue input signal to provide a sample input value, whereby the sample and hold means hold the sample input value until such time as the analogue input signal crosses one of the two, fixed threshold levels, $+\Delta V$ or $-\Delta V$, at which time the sample input value is adjusted, thereby adjusting the threshold levels relative to the input signal.

In this embodiment, the converter may comprise;

a differential amplifier, receiving at one input the sample input value and receiving at the other input the evolving analogue input signal, the differential amplifier providing an output signal derived from the input signal, and two comparators for comparing each of two, fixed threshold levels, $+\Delta V$, $-\Delta V$, with the derived signal and for providing the primary digital output signal to provide an indication that the derived signal, and therefore the input signal, has crossed a threshold level.

The converter may further comprise;

an absolute level crossing detection means, whereby the absolute-level crossing detection means provide an output each time the analogue input signal crosses the absolute level, and means for adjusting the threshold levels relative to the analogue input signal in response to the absolute-level crossing detection output so as to correct for any cumulative errors in the threshold levels as required.

This provides the advantage that any cumulative errors in the adjusted threshold levels or in the adjusted value of the input signal can be corrected for.

In one embodiment, the threshold levels themselves may be adjusted in response to the absolute-level crossing detection output. Alternatively, the analogue input signal may be adjusted in response to the absolute-level crossing detection output. Typically, the absolute-level crossing detection means may be a zero-crossing detection means.

In an alternative embodiment of the invention, the converter may comprise a flash analogue to digital converter for generating a plurality of fixed, digital threshold levels and for converting the analogue input signal into a binary coded digital output, and wherein the comparison means comprise logic circuitry for comparing the current binary coded digital output with the previous binary coded digital output to determine whether and in which direction a threshold level crossing occurred. Typically, the logic circuitry compares at least the two least significant bits of the binary coded digital output with at least the two least significant bits of the previous binary coded digital output to determine whether and in which direction a threshold level crossing occurred.

The timing means may comprise a timer counter for measuring the elapsed period of time which occurs between threshold level crossings. The timer counter may comprise means for determining when the maximum count has occurred.

In any of the embodiments of the invention, the converter may also comprise means for initially normalising the analogue input signal such that any two or more analogue input signals input to the converter have a common amplitude scaling. This is particularly advantageous for waveform matching or time series recognition applications.

The converter may also comprise an anti-aliasing filter which serves to limit the fastest rate of change of the analogue input signal so that the time interval to which the fastest rate of change corresponds is greater than the time the converter takes to provide an output digital representation following a threshold level crossing.

According to a second aspect of the invention, a nonlinear system analyser for analysing an analogue input signal is characterised in that it comprises;

the analogue to digital converter as herein before described, for generating a digital representation of the input analogue signal, processing means for receiving said digital representation and for generating a multi dimensional nonlinear predictive model, wherein the model is constrained such that it predicts the subsequent input signal.

The non linear system analyser may also comprise means for comparing the predicted sample input signal with the measured input signal.

According to third aspect of the invention, a method of converting an analogue input signal into a digital representation comprises the steps of;

(i) generating at least two threshold levels (UPPER, LOWER), (ii) comparing the at least two threshold levels with the input signal, (iii) generating a primary digital output signal to provide an indication that the input signal has crossed one of the threshold levels, characterised in that it comprises the additional steps of, determining the elapsed period of time between the input signal crossing a first threshold level and the input signal crossing a second threshold level at a later time, producing a secondary digital output signal representing the elapsed period of time between the input signal crossing a first threshold level and the input signal crossing a second threshold level at a later time, and providing a digital representation of the input signal from the secondary digital output signal and the corresponding primary digital output signal.

The method may comprise the further steps of;

providing a single UP/DOWN digital output signal from the primary digital output signal to indicate in which direction, UP or DOWN, the input signal crossed the threshold level, and providing a digital representation of the input signal comprising the secondary digital output signals and the associated UP/DOWN digital output signal.

The method may further comprise the step of expressing the digital representation as a 2's complement number. This provides the advantage that for subsequent computer processing.

The method may comprise the further step of adjusting the threshold levels relative to the input signal in response to a threshold level crossing.

The method may comprise the step of comparing the input signal with two threshold levels. In this case, the method may comprise the step of adjusting the threshold levels themselves in response to the input signal crossing a threshold level so as to adjust the threshold levels relative to the input signal.

Alternatively, a signal derived from the input signal may be compared with the threshold levels. In this case, the method may comprise the step of adjusting the derived signal in response to the derived signal crossing a threshold level so as to adjust the threshold levels relative to the derived signal.

BRIEF DESCRIPTION OF THE DRAWINGS

The invention will now be described, by example only, with reference to the following figures in which;

FIG. 13 shows a block diagram of a playback device which may be used to reconstitute the original input analogue signal and FIG. 14 shows a schematic diagram to illustrate a non-linear system analyser, including an analogue to digital interval converter.

DETAILED DESCRIPTION OF EMBODIMENTS

Figure 1:
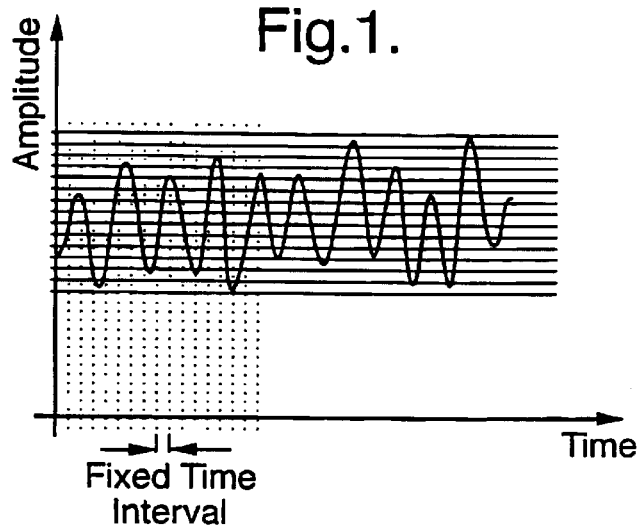
FIG. 1 illustrates a conventional analogue to digital sampling process in which the signal is sample at fixed time intervals.

In a conventional Analogue to Digital Converter (ADC), the input analogue signal is sampled at a fixed rate and samples are then converted to give a digital representation of the original signal. This sampling process is illustrated in FIG. 1. To convert analogue signals having high frequency components, a relatively short sampling period, $\Delta t$, must therefore be used. However, this results in an increased rate of output digital code. Furthermore, the high sampling rate results in an increased amount of unnecessary digital code for sections of the analogue input which have a relatively low frequency. For input analogue signals having both high and low frequency sections, a fixed sampling rate is not ideal as high frequency components may be lost or distorted by a lower frequency sampling rate whereas, for a higher frequency sampling rate, the low frequency components are oversampled. Conventionally, if the highest frequency component of an analogue signal is not known, the sampling frequency is determined by a band limiting filter applied to the input and the sampling frequency must be at least twice the bandwidth of this filter.

In the present invention, instead of making a fixed choice by using a regular sampling rate the past history and current evolution in time of the input signal is used to determine the "correct" time at which the next sample is taken. This process may be referred to as adaptive signal sampling.

Figure 2A:
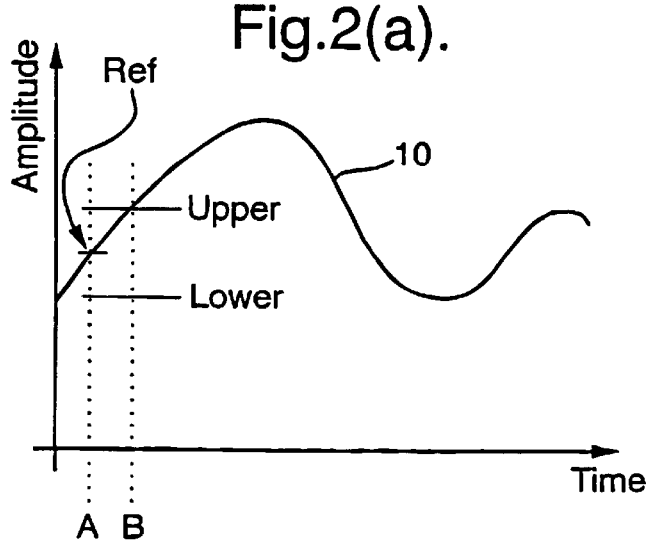
FIGS. 2(a) and 2(b) illustrate the temporally independent sampling process of the present invention.
Figure 2B:
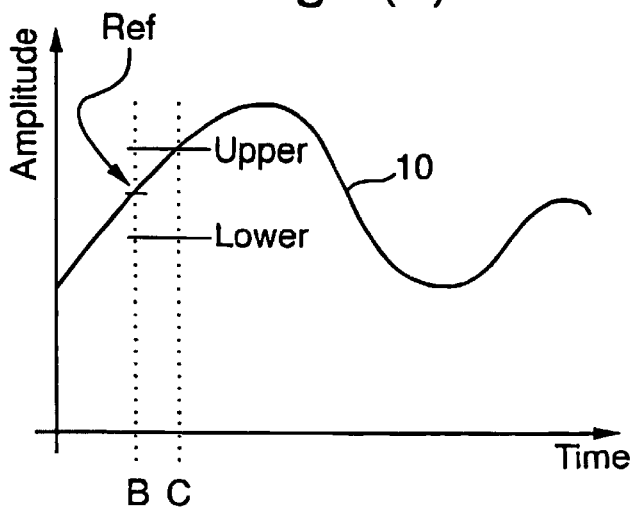

The principle behind the analogue to digital conversion method of the present invention is illustrated in FIGS. 2(a) and 2(b) which shows an input analogue waveform 10 evolving with time. A pair of dynamic UPPER and LOWER threshold values form an amplitude "window" about the current input analogue signal at a level REF. Referring to FIG. 2(a), time A is the time at which the input signal 10 has the value REF and time B is the later time at which the input signal 10 crosses the UPPER threshold level. When the input signal 10 crosses the UPPER threshold level (time B) a counter, counting clock pulses to measure a time interval, is reset and starts to count. The UPPER and LOWER threshold levels are moved to "track" the input signal 10, as will be described later, to new levels, as shown in FIG. 2(b), which form a window about the new value of the input signal (i.e. REF in FIG. 2(b)).

The system records the time interval between the input signal waveform 10 crossing the UPPER threshold level in FIG. 2(a) (time B) and crossing the UPPER threshold level in FIG. 2(b) (time C). The system also records the fact that the input signal 10 went UP one level, UP corresponding to the UPPER level being crossed. The UPPER and LOWER threshold levels are then moved to centre around a new reference level at time C and the process is repeated.

The output data set is therefore a combination of time intervals with UP or DOWN flags i.e. sign and magnitude representations. For computational convenience, this output may then be expressed as a 2's complement number for subsequent input to a computer.

The method of the invention operates in a different way to a conventional ADC in which the input signal is sampled at regular intervals in time and where the output consists of digital levels at fixed time intervals apart. For the purpose of this specification an analogue to digital converter which does not sample an input signal at fixed intervals in time, but whose output comprises a sequence of time interval values representing the time intervals between adjacent threshold level crossings shall be referred to as an Analogue to Digital Interval Converter (ADIC).

A primary advantage of the invention is that the sampling rate is determined by the rate of change of the input signal, and not by an imposed sampling time as in a conventional ADC. In the present invention, the dependence of signal sampling on absolute time is therefore removed. This makes the system particularly suitable for waveform matching applications. For example, an engine running at two different speeds will provide two signals evolving with different timescales. If the two different signals are input to the ADIC, the outputs are time sequences which can be normalised and therefore, when compared, will be recognised as a match.

Figure 3:
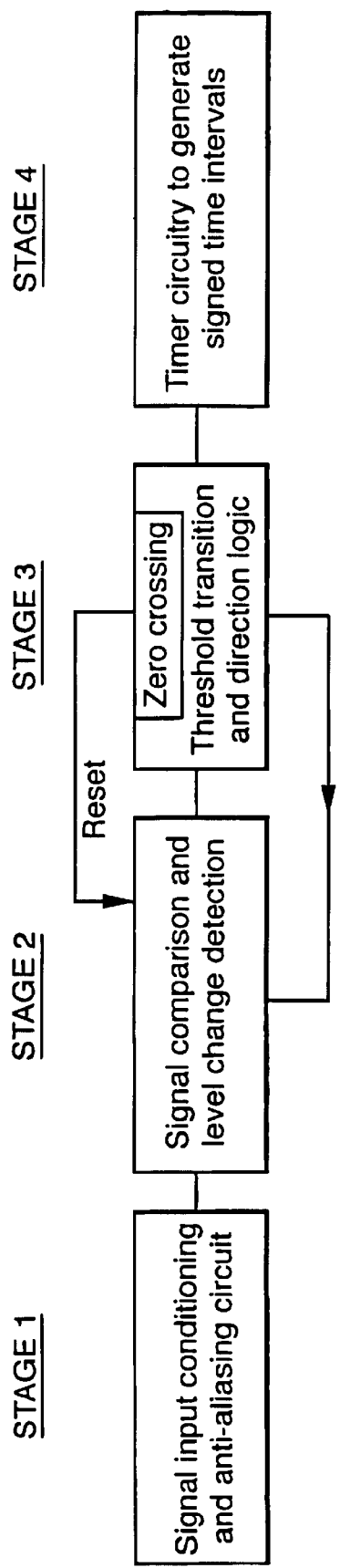
FIG. 3 shows a block diagram to illustrate the basic signal flow (STAGES 1 to 4) of the invention.

FIG. 3 shows a block diagram of the ADIC and analogue to digital interval conversion method of the present invention. STAGE 1 is the signal input and conditioning circuit, STAGE 2 is the signal comparison and level change detection circuit, STAGE 3 is the threshold transition and direction logic circuit, which feeds back to the previous stage (STAGE 2) to reset the UPPER and LOWER threshold limits, and STAGE 4 is the timer circuit for generating the digital representation of the inter-level time intervals.

At STAGE 1 amplitude normalisation of the input analogue signal may take place in an attempt to ensure that all signals which are processed have a common amplitude distribution. This is essential if the digital output from the ADIC is to be ultimately compared with digital outputs corresponding to other analogue signals, for example, in waveform matching or time series recognition applications.

By way of background, if a conventional ADC is to be used to its best advantage the maximum input voltage excursion should have a peak-peak value which explores all the possible binary codes the ADC can provide. This means that the peak-peak input signal approaches the maximum specified peak-to-peak input voltage for the ADC, $V_{fs}$. For example, an ADC converts a positive-full-scale analogue input voltage to a binary representation of 01111111 for an 8 bit 2's complement binary coded converter. Negative-full-scale is converted to 10000000. At half the positive-full-scale analogue input voltage the code is 00111111 and 11000000 for the negative. Therefore, to use the full resolution (all the bits) of the converter the maximum input voltage excursion must be greater than $V_{fs}/2$ and less than $V_{fs}$. Larger inputs than this will create an output representation which is a "clipped" version of the input, whereas smaller ones reduce the resolution with which the signal is represented and essentially waste the resolution capability of the converter. In conventional sampling systems this is not considered to be a problem, although conversion of two input waveforms with differing amplitudes will have different binary representations each requiring normalisation before they can be compared.

Similar constraints exist for the present invention in which the time taken for the input signal to change by $+/-\Delta V$ is of interest. If the amplitude of the input signal changes then each converted time interval will be scaled accordingly; ultimately to such an extent that there will be a different number of time intervals representing the signal. This situation will degrade the waveform matching ability of the conversion process.

If two waveforms are to be compared they should be applied to the converter with a common amplitude scaling. Automatic gain control (AGC) is a well known solution to this type of problem; the amplifier gain, however, has to be controlled on the basis of a common characteristic of the signals which varies with their amplitude. This characteristic will depend on the use made of the digital output of the converter. The input amplifier to the ADC has its gain controlled by a voltage calculated using the output voltage that is passed to the ADC. The relationship between this voltage and the control voltage can be established as the result of an arithmetic calculation. The input amplifier to the ADC has its gain controlled by the measured RMS power of the signal it passes to the converter. The RMS power of the signal can be measured over some time interval long compared to the maximum time interval encountered in the signal conversion process.

Alternatively the gain of the input amplifier can be established as the result of a nonlinear operation. The input amplifier to the ADC has its gain controlled by the excess of the modulus of the signal amplitude over a set threshold. This can be determined over a given time period or accumulated as a progressively increasing value. Derivations of these and other useful characteristics of a signal are well known to those skilled in the art.

Figure 4:
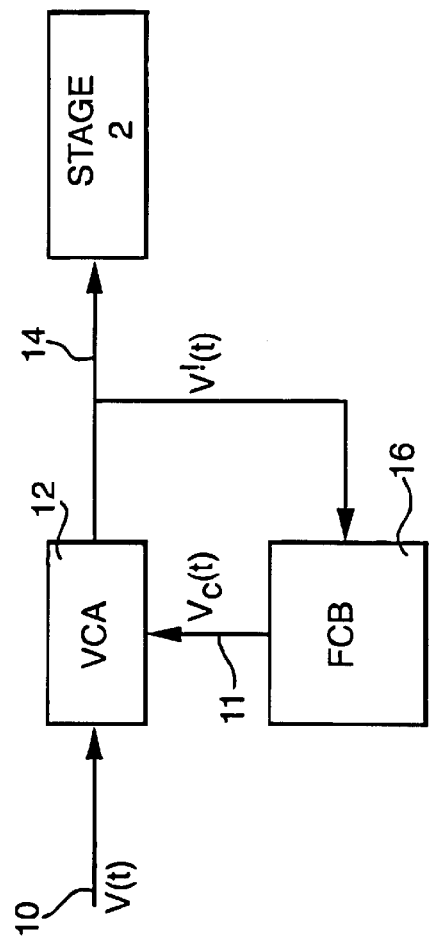
FIG. 4 shows a block diagram of a signal input conditioning circuit (STAGE 1) which may be used in the invention.

A block diagram of such an arrangement is shown in FIG. 4.

The arrangement shown in FIG. 4 comprises a voltage controlled amplifier 12 (VCA) into which the input signal 10 (V(t)) is input. The voltage controlled amplifier 12 has a gain function $G_\tau(t)$ determined by a control voltage 11 ($V_c(t)$) calculated by the function calculation block 16 (FCB) over a time $\tau$. The control voltage 11 sets the gain of the VCA 12 generating a conditioned voltage 14 ($V^1(t)$).

$G_\tau(t)$ is given by the relationship;

$$G_r(t) = G_0 + G_m\left(\frac{1}{1 + V_c(t)}\right),$$

$$G_\tau(t) = kV_c(t)$$

Where $G_0+G_m$ is the maximum gain of the VCA for no input signal, V(t), (i.e. $V_c(t) \rightarrow 0$, $G_\tau(t) \rightarrow G_0+G_m$), and $G_0$ is the minimum gain of the VCA (i.e. $V_c(t) \rightarrow \infty$, $G_\tau(t) \rightarrow G_0$) and k is a constant of proportionality.

The output 14 from the VCA 12 is given by the following;

$$V^1(t)=G_\tau(t)V(t)$$

This output is fed back to the FCB that calculates functional relationship between $V_c(t)$ and $V^1(t)$ over a time interval $\tau$, $V_c(t)=F(V^{49}(t),\tau)$.

If the chosen characteristic is the RMS signal power then $$F(V^1(t), \tau) \cdot = \sqrt{\frac{\int_\tau V^1(t)^2 \, dt}{t}},$$

If the chosen characteristic is the excess over a set voltage $V_{max}$ of the modulus of the peak signal amplitude then $$F(V^1(t), \tau).=\text{Largest}[(|V^1(t)|-V_{max})>0]$$

The voltage $V_c(t)$ is input to the VCA 12 to control the gain. The normalised output from the VCA 12 is passed to STAGE 2 of the ADIC.

STAGE 1 of the ADIC may also include an anti-aliasing filter for the input signal 10. Conveniently, the anti-aliasing filter may be included in the VCA. The anti-aliasing filter serves to limit the fastest rate of change of the input signal so that the time interval to which it corresponds is greater than the time the ADIC takes to convert. The construction of an anti-aliasing filter would be familiar to one skilled in the art.

At STAGE 2 the input analogue signal 10 is compared with the levels set by the preceding threshold crossing and, by this means, the change in level is detected. This may be implemented in several ways, as described below. Embodiment 1 relates to a dual-DAC embodiment which makes use of a counter, Embodiment 2 relates to an alternative dual-DAC embodiment which makes use of an adder and subtracter, Embodiment 3 relates to a flash ADC embodiment, and Embodiment 4 makes use of a sample and hold function. The particular application for which the ADIC is required will influence which of the embodiments is most preferable.

STAGE 2

Embodiment 1

Figure 5:
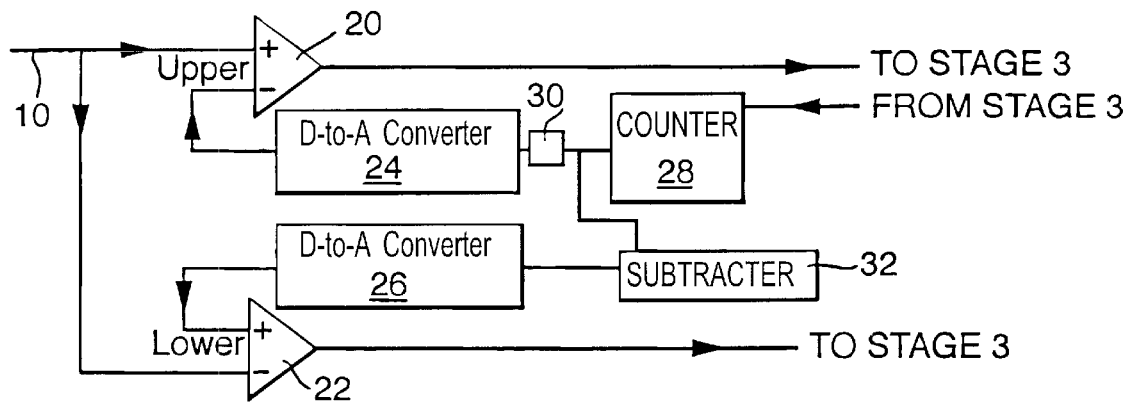
FIG. 5 shows a feedback circuit which may be used to implement signal comparison and level change detection (STAGE 2), FIGS. 6(a) and (b) show alternative circuitry which may be used to implement signal comparison and level change detection (STAGE 2)

FIG. 5 shows a feed back circuit comprising two comparators 20,22, two Digital to Analogue Converters (DACs) 24,26 and an UP/DOWN counter 28. The normalised and band limited input signal 10 is fed into one input of each of the two comparators 20,22. The circuit also comprises an adder 30 and subtracter 32 in the path between the UP/DOWN counter 28 and the DACs 24 and 26 respectively. The adder 30 adds one count to the counter output and the subtracter 32 subtracts one count from the counter output. Therefore, initially, one of the inputs to comparator 20 is $V_{REF}+\Delta V$ and one of the inputs to comparator 22 is $V_{REF}-\Delta V$, where $\Delta V$ is the threshold voltage corresponding to 1 count and $V_{REF}$ is the current value of the input signal. In other words, the UPPER threshold is set by DAC 24 and comparator 20 and is $\Delta V$ higher than $V_{REF}$ and a LOWER threshold is set by DAC 26 and comparator 22 and is $\Delta V$ lower than $V_{REF}$. The UPPER and LOWER threshold levels therefore form a "window" about the current value of the input signal.

Using this arrangement, one of the comparators (comparator 20) compares the input signal 10 with an UPPER threshold level and the other (comparator 22) compares the input signal with a LOWER threshold level. The comparators 20,22 therefore serve to determine whether the input signal 10 is "increasing" or "decreasing" by comparing the current value of the input signal with the UPPER and LOWER threshold levels. This is achieved as follows. As the input signal evolves, it will become equal to either the UPPER or LOWER threshold value (+/−$\Delta V$). This causes the corresponding comparator (20 or 22) to provide a digital output which is fed into STAGE 3 (details not shown in FIG. 5). The threshold (UPPER or LOWER) which has been crossed is determined and the appropriate UP or DOWN signal is generated in STAGE 3. The UP/DOWN signal generated in STAGE 3 forms part of the ADIC output along with the time interval between the current threshold transition and the previous one (to be described later). This UP/DOWN signal from STAGE 3 is also fed back from STAGE 3 into the UP/DOWN counter 28 to increase or decrease the count accordingly. This subsequently adjusts the count input to the DACs 24,26 and therefore the comparator inputs are shifted, up or down on either side of the input signal, depending on whether the input signal has increased or decreased.

In summary, each time the input signal 10 crosses either the UPPER or LOWER threshold level, the following sequence of events occurs; the output from the comparator (20 or 22) triggers the subsequent threshold transition and level change direction logic (STAGE 3) to determine which of the threshold levels was crossed and in which direction (UP or DOWN) the transition occurred. The UPPER and LOWER threshold levels are then readjusted, to establish a window around a new reference level, and the generation of a time interval at STAGE 4 is initiated.

Several different arrangements of the adder 30 and subtracter 32 may be used. For example, in practice, the subtraction of one count may be more easily implemented by adding a negative count. Alternatively, an adder or subtracter may be included in only one of the paths to the DACs, with the other DAC receiving the count directly from the counter 28. However, the arrangement described above with reference to FIG. 5 is preferred as it avoids problems associated with noise which arise if the last input value is one of the threshold levels, as in the single adder (or subtracter) case. Furthermore, by including an adder or subtracter component in the paths between the UP/DOWN counter 28 and both of the DACs 24,26, no differential time delay is introduced between the two signal paths.

In this embodiment of the invention (Embodiment 1), adjustment of the threshold levels is limited to +/−$\Delta V$ in all circumstances because the UP/DOWN counter 28 counts up or down by +/−1 following a threshold level crossing. For example, consider the case where the UPPER threshold is +2$\Delta V$ and the LOWER threshold is −2$\Delta V$. If the UPPER threshold level is crossed by the input signal the counter will increase the thresholds by +1$\Delta V$. The UPPER threshold therefore goes to +3$\Delta V$ and the LOWER threshold goes to −1$\Delta V$ and so the threshold levels do not form a symmetric window about the input signal. However, depending on the nature of the input signal to be converted to digital form, it may be useful to be able to change the pre-set value of threshold voltage level. For example, if an input signal has a large degree of noise fluctuation, a small threshold value (such as $\Delta V$) will cause an unnecessarily large number of level transitions to be registered, thus producing a larger data output stream than is necessary to determine the general trend of the input waveform. Embodiment 1 is limited in this respect. This limitation may be overcome using the alternative embodiment of STAGE 2 of the invention (Embodiment 2), as described below.

STAGE 2

Embodiment 2

An alternative circuit (Embodiment 2) for implementing STAGE 2 is shown in FIGS. 6(*a*) and 6(*b*). Embodiment 2 operates to vary upper and lower threshold levels so as to maintain the amplitude of the input signal between them, as described previously for Embodiment 1. This embodiment provides the further advantage over Embodiment 1 that the threshold voltages can be selected to be any number of DAC levels. For practical reasons, the selected threshold value must not be excessive to enable the DAC levels to change for an increase or decrease in the input signal. In this embodiment, problems arising due to noise fluctuations on a signal which would otherwise result in an UPPER or LOWER threshold level being crossed can be avoided by increasing the magnitude of the threshold voltage.

Referring to FIG. 6(*a*), the circuit comprises a buffer 40 which buffers the input signal 10. The buffer 40 outputs the input signal 10 to two comparators 42,44. The two comparators 42,44 also receive the value of the UPPER and LOWER threshold levels from outputs 46 and 48 from DACs 50 and 52 respectively. The comparators 42,44 therefore serve to determine whether the input signal is "increasing" or "decreasing" by comparing the current input sample with the UPPER and LOWER threshold levels, as for Embodiment 1.

The outputs from comparators 42,44 are passed to a control logic circuit 54 (shown in detail in FIG. 6(*b*)), where new values of the UPPER and LOWER threshold levels are set. If the UPPER threshold is crossed, comparator 42 provides an output UP signal, 90a, to the control logic circuit and if the LOWER threshold is crossed comparator 44 provides an output DOWN signal, 90b, to the control logic circuit 54.

Figure 6A:
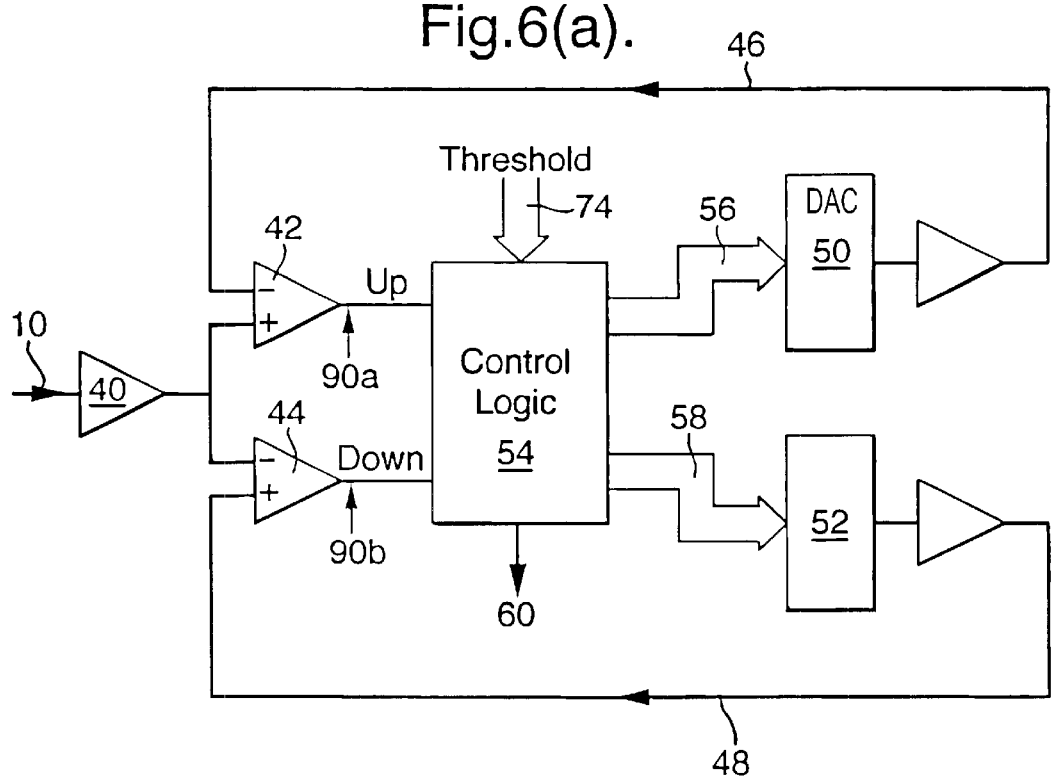
Figure 6B:
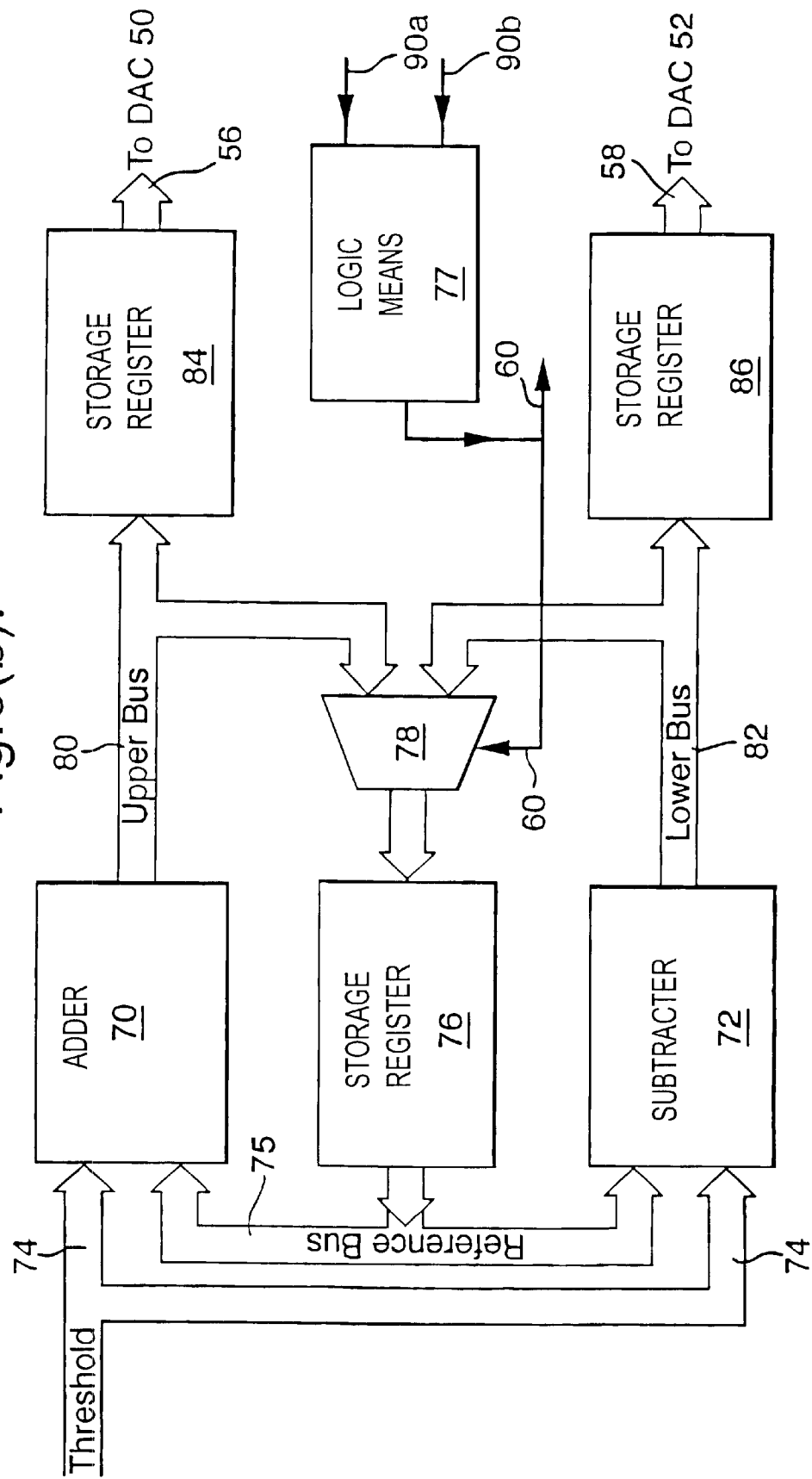

Referring to FIG. 6(b), the UP/DOWN outputs 90a, 90b from comparators 42,44 (as shown in FIG. 6(a)) are input to logic means 77, to derive a single output signal 60 having a value of 0 or 1 (0 to indicate DOWN, 1 to indicate UP) to initiate the appropriate change in the threshold levels, as described below. Outputs 56, 58 from the control logic circuit 54 then provide the new UPPER and LOWER threshold levels to DACs 50,52.

The elements of the control logic circuit 54 include an adder 70 and a subtracter 72. A threshold value. 74 ("THRESHOLD") is input to the adder 70 and subtracter 72 by the user. The adder and subtracter serve to calculate values of the UPPER and LOWER threshold levels respectively from the THRESHOLD and a reference value ("REFERENCE") which is stored in a storage register 76 and has the value of the preceding input signal. The UPPER threshold value is equal to REFERENCE plus THRESHOLD and the LOWER threshold value is equal to REFERENCE minus THRESHOLD.

The circuit 54 also comprises a multiplexor 78. The UP or DOWN signal 60, derived from one or other of the comparators 42,44, is input to the multiplexor 78 which selects data for transfer through the multiplexor depending on the direction of change in amplitude of the input signal 10; the data on busses 80 and 82 at this time are static and are equal to the last REFERENCE value latched by register 76 plus or minus the THRESHOLD value. Output storage registers 84,86 store the UPPER and LOWER threshold values respectively for subsequent input to the DACs 50,52, and thus for subsequent input back to the comparators 42,44.

The UP/DOWN signal 60 (i.e. that signal provided to the multiplexor 78 to initiate selection of one or the other of the UPPER or LOWER threshold values) also forms part of the ADIC output. The ADIC output also comprises a time interval signal which is the time interval between the preceding and the present threshold level transition. The time interval is deduced at STAGE 4 of the ADIC.

When the mulitplexor output is static the data is latched by register 76 and becomes the new value of the REFERENCE bus 75. Data on the REFERENCE bus 75 and the value of the THRESHOLD are then used to calculate new values for the UPPER and LOWER busses 80,82 by the adder 70 and subtracter 72 respectively. During the period of these changes the values input to the DACs 50,52 are maintained by registers 84,86 respectively. The cycle is completed by clocking registers 84,86 to latch the new UPPER and LOWER threshold levels for conversion by the external DACs 50,52. The DAC outputs 46,48 provide equivalent analogue thresholds which lie above and below the current amplitude of the input signal (subject to bandwidth considerations). The process is organised by a sequence of clock signals (not shown in FIGS. 6(a) and 6(b)) and the circuit is left with static data on the UPPER bus 80 and the LOWER bus 82 ready for the next cycle start.

Figure 7A:
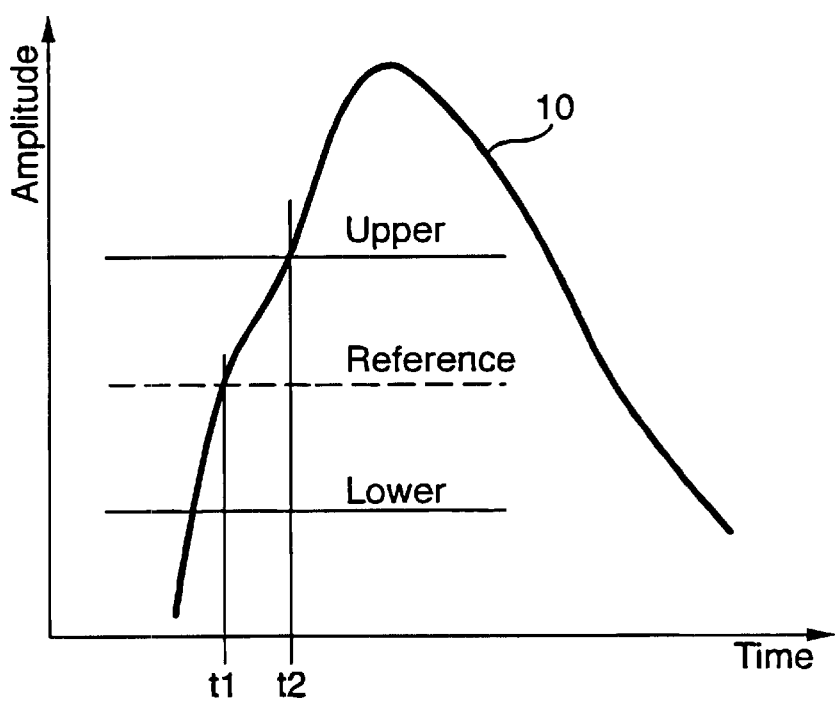
FIGS. 7(a)–(f) illustrate the variation of the UPPER and LOWER threshold levels as the input signal varies over time for the circuit shown in FIG. 6.

In order to understand the general principle of operation of Embodiment 2 it is also helpful to consider how the UPPER and LOWER threshold values change over time. These changes are depicted in FIG. 7; (a)–(e) show a sequence of events in time and (f) shows the locus delineated by this sequence. The input signal waveform is referred to generally as 10. Referring to FIG. 7(a), at time t1 the input signal 10 is equal to REFERENCE and the UPPER and LOWER threshold levels (i.e. the DAC levels) respectively have values equal to the REFERENCE value plus or minus a threshold value (ΔV). The threshold value (ΔV) can be determined by the user. As in the embodiment shown, it is preferable to add and subtract the same threshold value (ΔV) to the REFERENCE level to give UPPER and LOWER levels which are equidistant in magnitude from the REFERENCE level. However, it is also possible to implement UPPER and LOWER threshold levels which are not equidistant from the REFERENCE level.

Figure 7B:
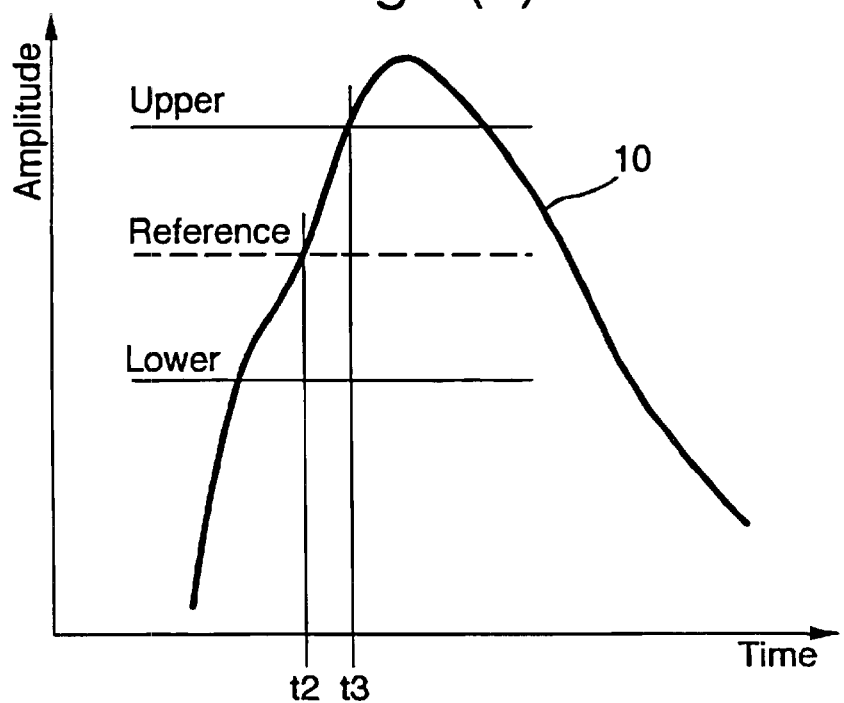

At later time t2, the input signal has crossed the UPPER threshold level i.e. REFERENCE has increased and has the value of the preceding UPPER threshold. At this time, t2, both thresholds (UPPER and LOWER) are moved to their new, increased levels, as seen in FIG. 7(b). Therefore, for an increase in the input signal 10 the effect is that the UPPER level (FIG. 7(a)) is shifted upwards, as is the LOWER threshold level, to their new, increased levels (as shown in FIG. 7(b)) which are established about the REFERENCE level at the later time t2. The UPPER and LOWER threshold levels have therefore changed by the threshold value (ΔV) with the evolving input signal 10.

Figure 7C:
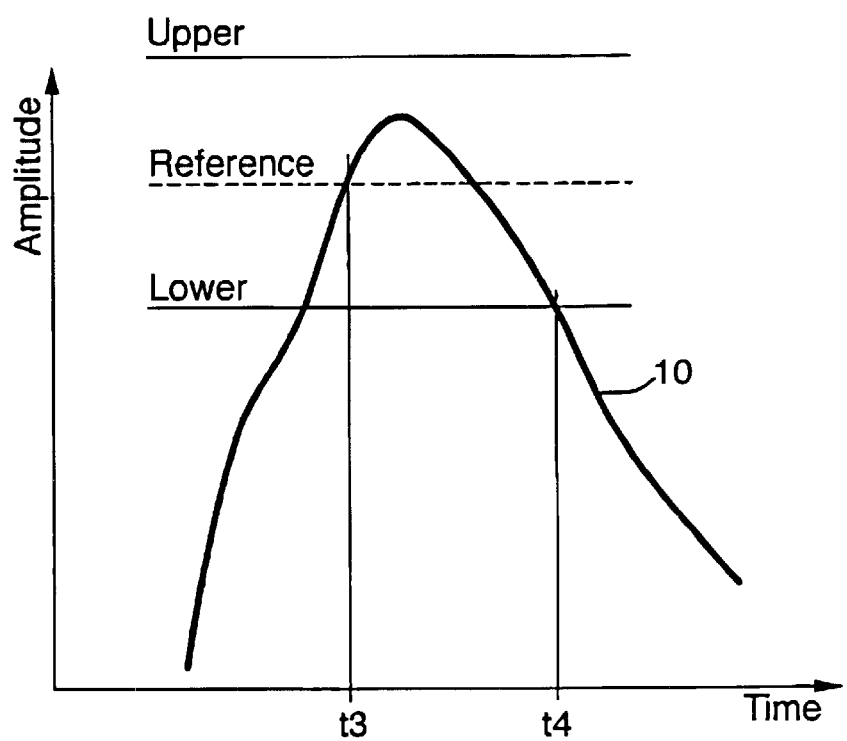
Figure 7D:
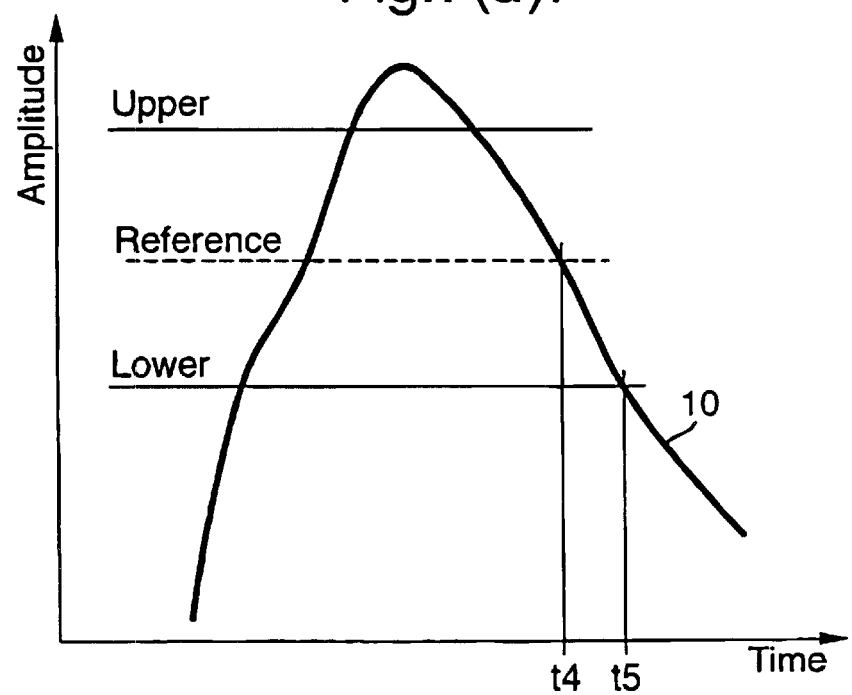

Moving on in time, at time t4 (FIG. 7(c)) the now decreasing input signal 10 crosses the LOWER threshold level i.e. the REFERENCE level has decreased and has the value of the preceding LOWER threshold. At this time, t4, both threshold levels are moved to their new, decreased levels, as seen in FIG. 7(d). Therefore, for a decrease in the input signal the LOWER level is shifted downwards as is the UPPER level to new decreased levels (FIG. 7(d)) established about the REFERENCE level at the later time t4.

Figure 7E:
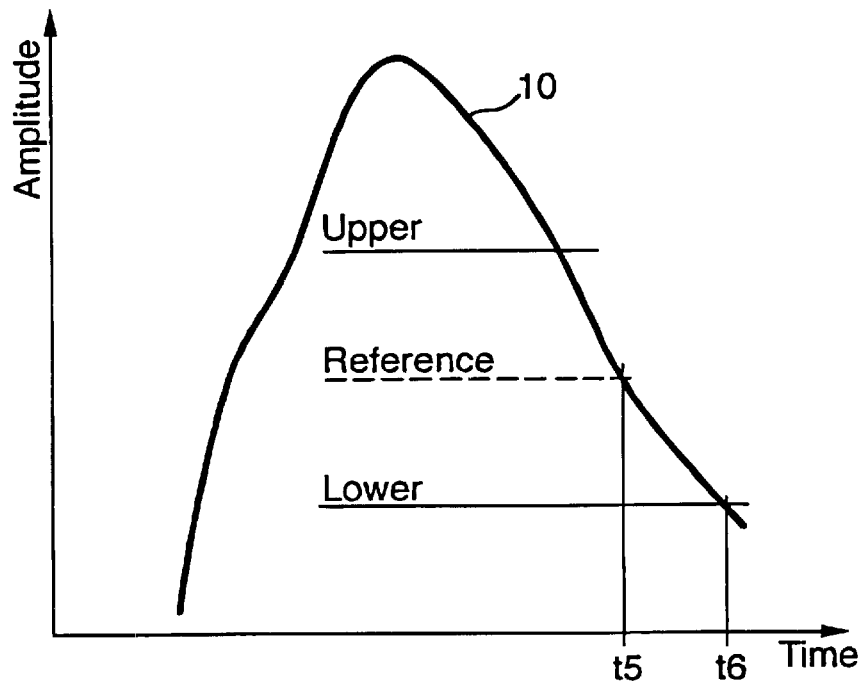
Figure 7F:
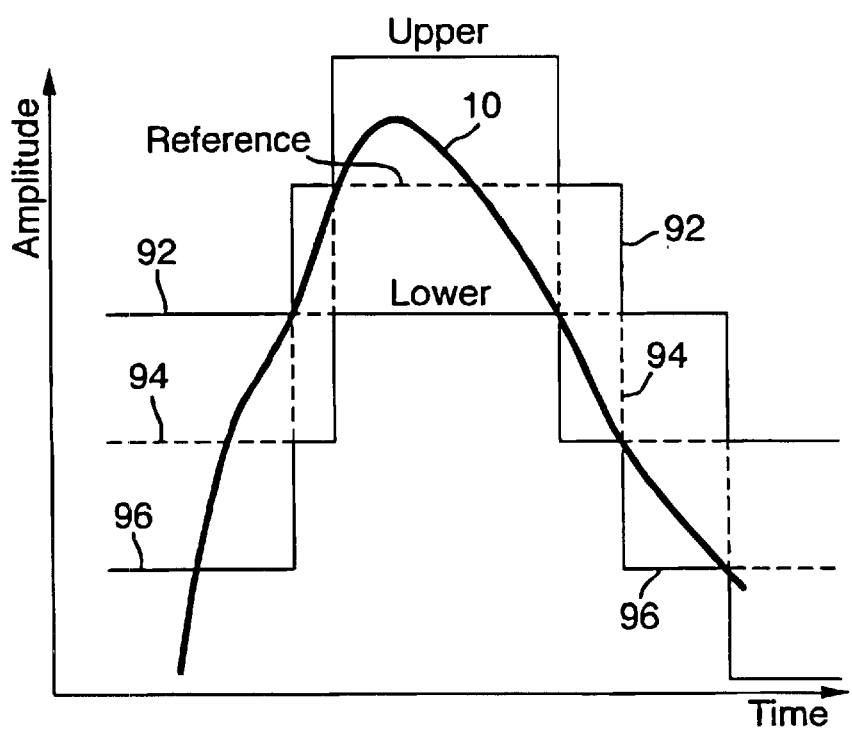

The process continues through FIGS. 7(d) to 7(e) as the input signal 10 reaches time t6. FIG. 7(f) shows the time evolution of the UPPER, REFERENCE and LOWER levels (92,94 and 96 respectively) during this period of evolution of the input signal.

It may be advantageous to employ an absolute level crossing detection means in STAGE 3 to indicate that the input signal 10 has crossed an absolute level, for example zero volts. The effect of the absolute level crossing detection signal is to reposition the REFERENCE, UPPER and LOWER levels at and about the known absolute value of the input voltage, thereby removing any cumulative errors which may have occurred in the threshold levels. In this way, each time the input signal crosses zero, for example, the threshold levels are reset around zero. This is achieved by feeding back the zero crossing detection signal to STAGE 2. The absolute level crossing detection means and reset may also be included in the previous example shown in Embodiment 1.

STAGE 2

Embodiment 3

Figure 8:
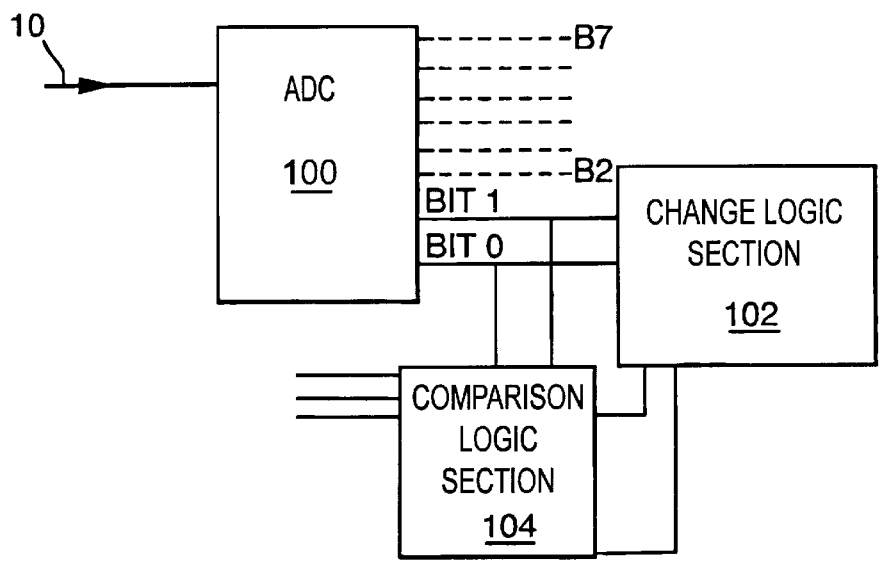
FIG. 8 shows an alternative circuit which may be used to implement signal comparison and level change detection (STAGE 2), comprising a flash analogue to digital converter.

In another alternative embodiment (Embodiment 3), a flash analogue to digital converter (flash ADC) may be used to implement the signal comparison and level change detection of STAGE 2 of the system. FIG. 8 shows a circuit comprising a flash ADC 100 (STAGE 2) in combination with the elements required for STAGE 3 of operation (i.e. threshold transition and direction logic). STAGE 3 comprises a level change logic section 102 and a comparison logic section 104. The flash ADC 100 comprises an array of threshold detectors having thresholds increasing by a common value, ΔV. The flash ADC 100 may be free running or may be clocked and samples the input analogue signal 10.

The output of the flash ADC 100 is decoded so that at least a two bit code is available whose current value and the previous history of values can be used to determine the direction of and interval between the threshold crossings at STAGE 3. Usually, the two bit code will be the two least significant bits (LSBs) of a binary coded output (BITs 0 and 1 in FIG. 8). The digital output of the flash ADC 100 is then fed directly to the level change logic section 102 and the comparison logic section 104 to determine if either the UPPER or LOWER threshold level has been crossed. This is done by comparing the current binary coded output with previous binary coded outputs, or at least, by comparing the current the binary coded output with the previous two adjacent binary coded outputs.

If a level change is detected, the comparison logic 104 determines in which direction the transition occurred by comparing the output from the level change logic with the 2 least significant bits of the two previous decoded outputs from the flash ADC. It is necessary to store the most recent three output changes in order that the direction of motion can be correctly obtained.

Figure 9A:
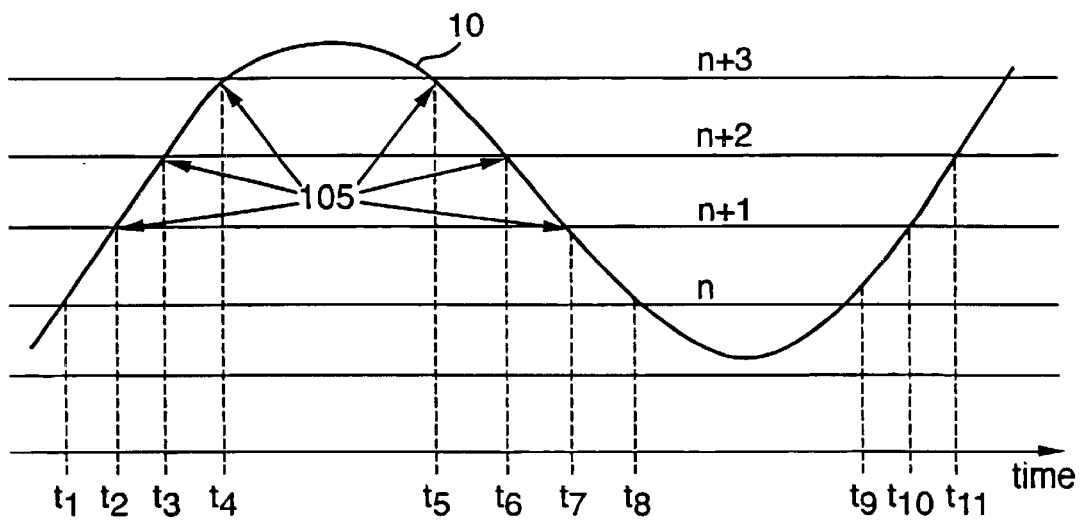
FIG. 9(a) illustrates the principle of operation of a flash ADC converter (as shown in FIG. 8)

FIG. 9(a) illustrates how the flash ADC system works. The flash ADC levels are referred to as n, n+1, n+2, n+3. The level crossings are indicated by reference numeral 105. A level change will only be produced when the input signal has gone up or down a full quantisation level from the previous one. The input signal 10 shown in FIG. 9(a) starts at n, having come up from level n−1. The level it has crossed in doing so is therefore between n−1 and n. For the signal to go up one level it must cross the level between n and n+1 and to go down it must cross the level between n−1 and n−2. Therefore, when the signal 1 reaches the n+3 area in the figure, it can be seen that a level change should only occur when the signal reaches the level between n+2 and n+1.

Figure 9B:
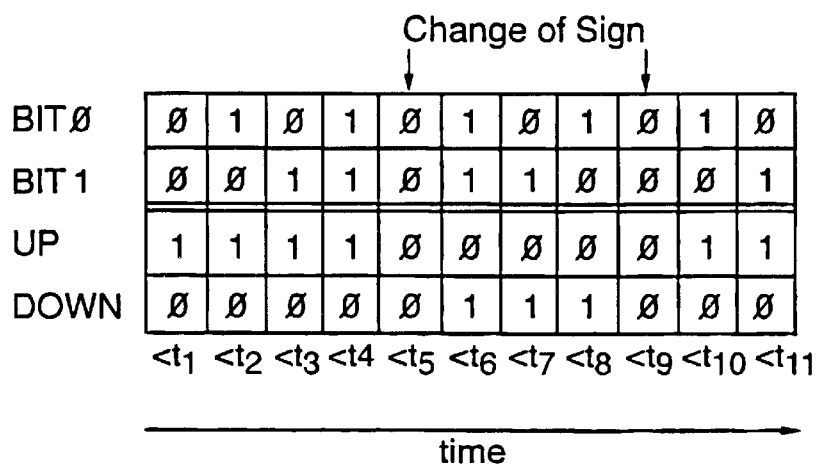
FIG. 9(b) shows a table to indicate how the level crossing direction can determined from the flash ADC output.

FIG. 9(b) shows a table to illustrate how the two LSBs of the digital output from the flash ADC are used to determine in which direction the level crossing occurred. The direction UP or DOWN is determined by considering the difference between the current BITS 0 and 1 and the preceding BITs 0 and 1 (UP=+1, DOWN=−1). For the columns indicated "CHANGE OF SIGN" (corresponding to times t5 and t9), there has been no full change in threshold, ΔV, since the last level crossing and therefore there is no signed time interval output from the ADIC. For example, considering the earliest change of state (time t5), only when the input signal crosses level n+2 at time t6 is a threshold crossing registered (DOWN) and then a time interval corresponding to t6−t4 will be output.

Figure 10:
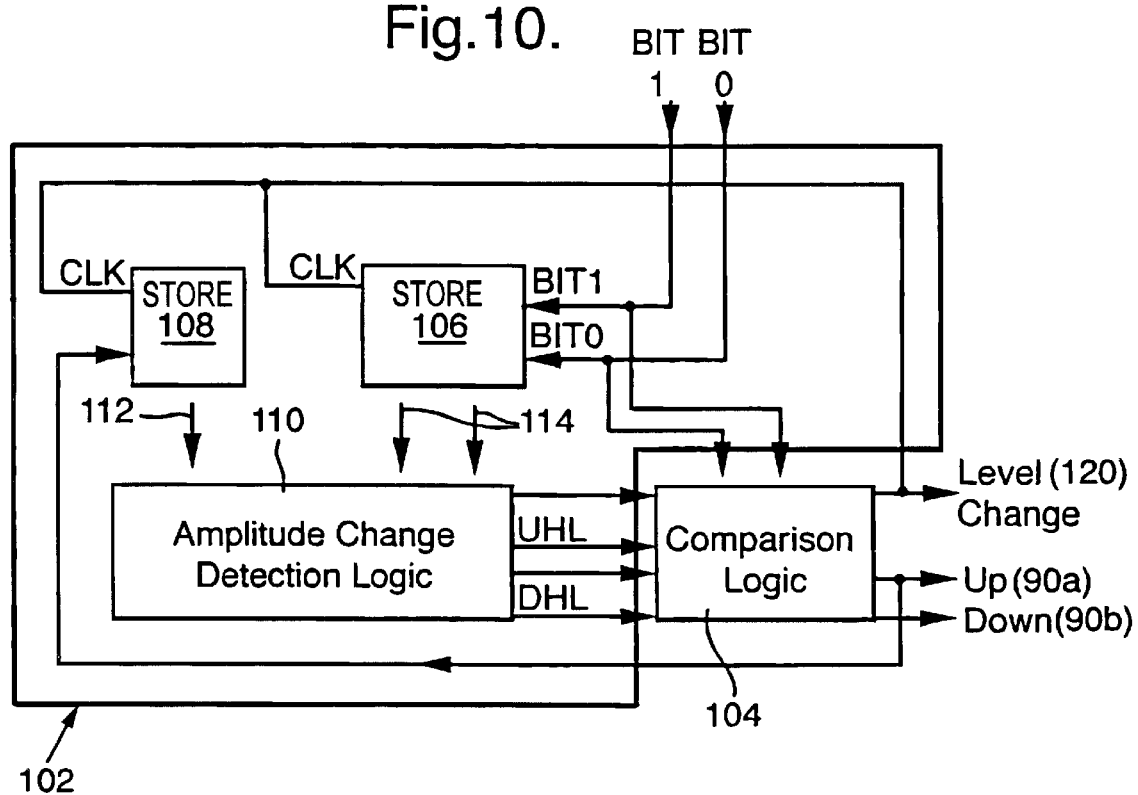
FIG. 10 shows a diagram of the logic circuitry (STAGE 3) which may be used for the level change detection in FIG. 8.

FIG. 10 shows a possible implementation of the logic which may be used to implement the level change detection of STAGE 3 (i.e. box 102, also shown in FIG. 8). The two least significant bits, BIT 0 and BIT 1, from the flash ADC 100 constantly provide two data bits to the comparison logic 104. The level change detection logic 102 comprises a two bit level store 106, a single bit data store 108 and amplitude change detection logic 110. BIT 0 and BIT 1 are also passed to the two bit data store 106 to hold their state at the last level change and a single bit level store 108 to hold the associated '1' or '0' value describing whether the level change was an UP or DOWN (output 112). Therefore, there is a memory which indicates where the signal was last clocked (outputs 114) and a memory which remembers in which direction it moved.

As a result, the amplitude change detection logic 110 uses this information to create values $U_{HL}$ and $D_{HL}$. The comparison logic 104 then compares $U_{HL}$ and $D_{HL}$ with BITs 0 and 1. When the comparison logic 104 detects a match between BIT 0 and BIT 1 and either $U_{HL}$ or $D_{HL}$, signifying an UP or DOWN level change, a level change pulse 120 is emitted with the relevant UP or DOWN output, 90a or 90b, respectively, clocked high. As described previously, the UP and DOWN outputs may be coupled to give a single logic output (0=DOWN, 1=UP). The two bit data stores may comprise edge triggered D-types and are clocked by the level change pulse 120.

As a result of the level change output 120 going high, the 2-bit register clocks and shifts the relevant data across. The level change output is then passed to a timer circuit (STAGE 4) to trigger a counter device. A zero or absolute level crossing detection means may also be included in the flash ADC embodiment of the invention, as described previously.

STAGE 2

Embodiment 4

Figure 11:
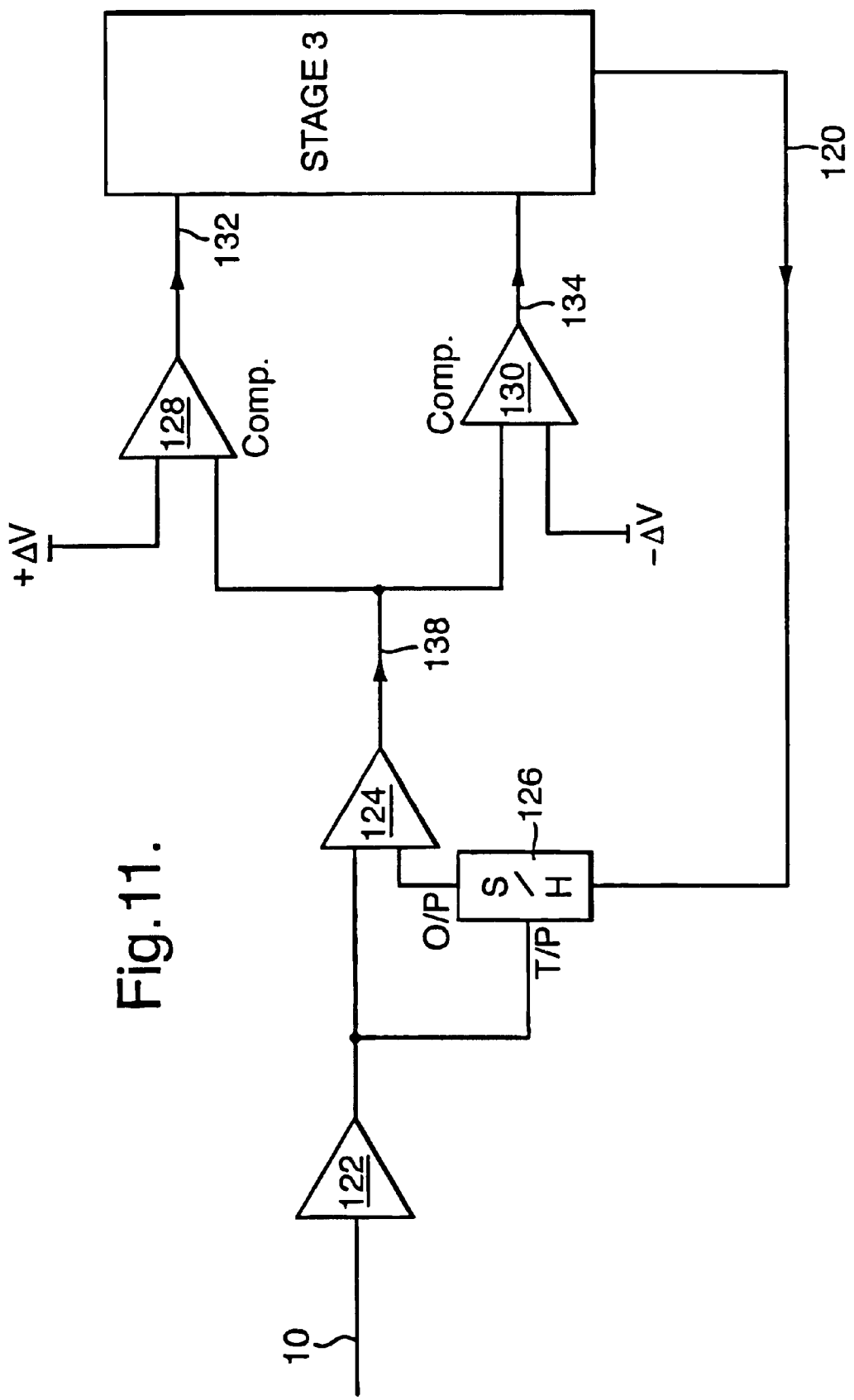
FIG. 11 shows an alternative circuit which may be used to implement signal comparison and level change detection (STAGE 2), comprising a Sample and Hold.

An alternative circuit (Embodiment 4) for implementing STAGE 2 is shown in FIG. 11. The circuit makes use of a sample and hold function at the input. Only two threshold levels are required in this example, as in Embodiments 1–3. However, in this case, the thresholds themselves are not varied dynamically as the input signal evolves. Instead, means are provided for adjusting a derivation of the input signal as it is applied to two, fixed threshold levels. In this embodiment, the derived signal is compared with the threshold levels. The thresholds therefore appear to vary dynamically as the input signal evolves, even though they are maintained at fixed levels. In each case, the effect of adjusting either the threshold levels or the derived signal in response to a threshold level crossing is to effectively reinstate a common threshold (e.g. +/−ΔV) between the input signal and each of the UPPER and LOWER threshold levels following each threshold crossing. For the purpose of this specification the phrase "adjusting the threshold levels relative to the input signal in response to the input signal crossing a threshold level" shall be taken to mean either that the threshold levels are adjusted explicitly in response to the input signal crossing a threshold level or that a derivation of the input signal is adjusted in response to the derivation of the input signal crossing a threshold level (i.e. the threshold levels are implicitly adjusted).

The phrase "comparing the input signal with threshold levels" shall be taken to mean either that the input signal itself is compared with threshold levels or that a derivation of the input signal is compared with threshold levels.

Referring to FIG. 11, the circuit comprises an input buffer 122 which buffers the input signal 10. From here the input signal is passed to both a differential amplifier 124 and a sample and hold (S/H) 126 which samples the input signal and holds the value for a certain period until a threshold crossing occurs. The circuit also comprises two comparators 128,130. The threshold level for one comparator (128) is +ΔV and the threshold level for the other (130) is −ΔV, both threshold levels remaining fixed at these values at all times. The outputs 132,134 from the comparators 128,130 are passed to the comparison and level change detection logic of STAGE 3. As described previously, the output from STAGE 3 provides the ADIC output (a digital representation of signed time intervals). The level change detection signal 120, to indicate that one or other of the threshold levels, +/−ΔV, has been crossed, is also fed back from STAGE 3 to the S/H 126.

Initially, the signal 10 is input, via a buffer 122, to one input of the differential amplifier 124. The other input is taken from the S/H 126 which is assumed to be holding the same value as the input signal 10. At this time, the output 138 from the differential amplifier 124 is therefore zero. The S/H 126 holds this sampled value of the input signal and, if the input signal increases, the differential amplifier output will increase in a positive direction until the inputs received at comparator 128 are eventually equal. When the input signal crosses the threshold +ΔV the comparator 128 will trigger. The comparator output 132 is passed to STAGE 3, to provide an indication to the threshold transition and direction logic that the upper threshold level (+ΔV) has been crossed.

STAGE 3 outputs a signal 120 to indicate that a level has been crossed and this is fed back to the S/H 126 to sample the output from the buffer 122 and thus reset the differential amplifier output to zero ready for the next input signal sample. As before, the S/H holds the last value of the sampled input signal while the input signal continues to evolve, until the input signal again increases or decreases by an amount +/−ΔV, thereby crossing one of the threshold levels and causing the appropriate comparator to change logic state. The sequence continues and each time a comparator triggers, to indicate a threshold has been crossed, the timing circuitry is started and time intervals between level crossings, and the direction of the change of the level crossing, are output from STAGE 3 to form the output from the ADIC.

Due to the finite capacitance of the S/H, which causes slow "memory loss" of the stored voltage, this embodiment may not be particularly suitable for slowly evolving input signals as the input value may not be held by the S/H for a sufficiently long enough time for the input signal to cross a threshold level +/−ΔV. The time constants associated with the S/H are selected depending on the particular application of the ADIC. For some application, such as for highly dynamic input signals, the Embodiment 4 embodiment may have advantages.

STAGE 4

Figure 12:
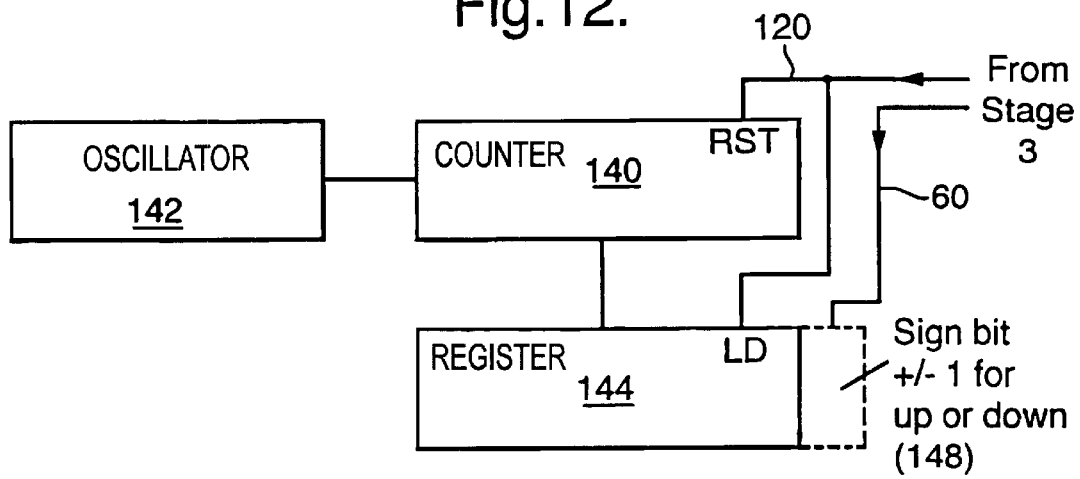
FIG. 12 shows a diagram of the timing circuit (STAGE 4) which may be used in the invention.

An example of the timing circuit which may be used is shown in the block diagram in FIG. 12. The circuit is responsible for generating signed time intervals between threshold transitions. In each of the embodiments of the ADIC described previously, the signals received by the timing circuitry include the sequence of pulses from the STAGE 3, the time interval between each successive pulse being the required time interval between threshold crossings, the direction (UP or DOWN) in which the last level crossing occurred.

Referring to FIG. 12, the signed time intervals form the output from the ADIC. A counter 140 is driven from a fixed rate oscillator 142. The count continues until a threshold is crossed, triggered by the level change output at STAGE 3, at which point the counter contents are moved to a register 144 and the counter 140 is reset and restarted. The direction of the transition (UP or DOWN), provided by the UP/DOWN signal 60, is converted by the logic in STAGE 3 to a sign bit (UP or DOWN) 148 which is combined with the register value to give a signed time interval. The signed time intervals stored in register 144 form the digital representation output from the ADIC.

In addition, different embodiments of the invention may provide additional signals to the timing circuitry of STAGE 4. For example, regarding Embodiments 1–3, a pulse indicating that the input signal has crossed an absolute known voltage level, which may be set to zero volts, may also be provided to STAGE 4. A flag indicating the direction of the absolute level crossing may also be passed to STAGE 4. In this way, the resetting of the threshold levels about the absolute voltage level does not result in the output of a timing interval (unless it corresponds to a genuine threshold level crossing). An additional signal may also be passed to the timing circuitry to indicate the time interval for which the threshold crossing is operating in an indeterminate or erroneous state.

One problem which may have to be addressed is the problem of the maximum count. This occurs when the input signal does not cross a threshold before the counter overflows. For example, the counter may be arranged such that at maximum count it registers the overflow and resets, so that the total interval for the transition is the maximum count (or more than one maximum count depending on the number of times the counter overflows) plus an actual count. Each time the counter overflows the maximum count is shifted to a FIFO for input to the subsequent processing means and the counter is reset to start counting again from zero. When a threshold crossing eventually occurs an UP/DOWN signal is received from STAGE 3, at which time the current count is added to the maximum count (or however many maximum counts have occurred since the last threshold crossing) to determine the time interval between the current threshold crossing and the preceding one. A problem may arise if, during the finite time the counter takes to reset when an overflow occurs, a threshold level crossing occurs. If encountered, this problem may be avoided in a number of ways using conventional electronic techniques.

SIGNAL PLAYBACK

Figure 13:
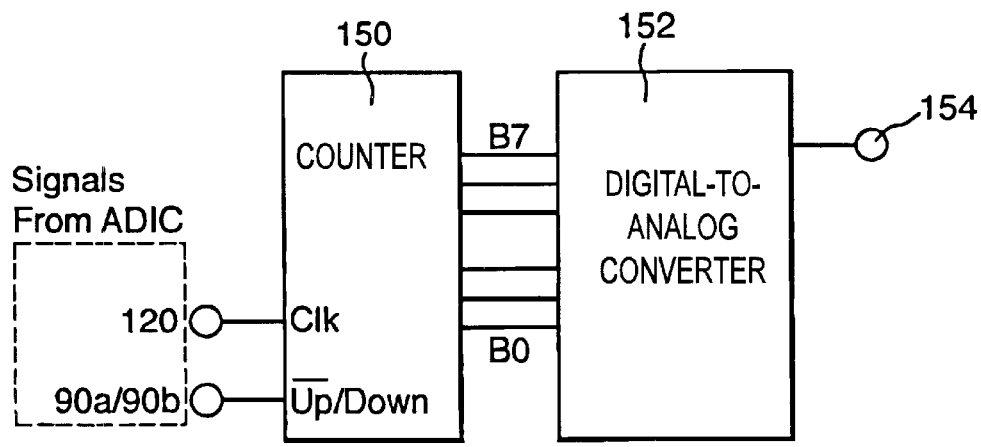

A playback device which may be used to reconstitute the sequence of sampled amplitudes of the original analogue signal from the ADIC digital output is shown in FIG. 13. The level change pulse 120 and the UP/DOWN signal output 90a, 90b are input to an 8 bit counter 150. The 8 bit counter 150 is an UP/DOWN counter, the level change pulse is delayed slightly to allow the correct UP/DOWN control to be applied and then the counter 150 is clocked by the level change pulse. The value of the counter 150 is constantly connected to an 8 bit Digital to Analogue converter (DAC) 152 and the value apparent at the DAC output 154 is the reconstituted input signal. As with conventional sampling, these amplitudes may be subjected to interpolation and fitting routines to produce a smooth function of time. The advantage of the ADIC is that the amplitudes do not have the inter-level uncertainty of conventional ADCs. Instead the uncertainty is associated with the time intervals. However, time can be measured with much greater precision than amplitude.

APPLICATIONS OF THE ADIC

The ADIC of the invention may be used to provide a solution to the well known problem of offset correction across an array of detectors. Each element of the detector array may be input to an ADIC of the present invention. As described previously, the signed time intervals output from the ADICs will correspond to the rate of change of the input signal. They will not correspond to the constant or slowly changing offset. Each detector output signal can therefore be reconstructed from the ADICs outputs on a common offset across the array. By using an RMS signal power controlled amplifier, it may also be possible to correct for the detector gain as well.

The ADIC of the present invention provides an output which is advantageous for applications of waveform matching and recognition applications, as the temporal dependence of the sampling technique is removed. For two input waveforms obtained from the same physical system, such as a car engine running at two different speeds, the two digital representations obtained from the ADIC will be recognised as a match. This is not the case for conventional regular interval analogue to digital conversion.

The ADIC of the invention may be used at the input stage of a nonlinear system analyser which is used, in particular, for the analysis of data in the time domain. Data analysis in the time domain is used in preference to frequency domain analysis using discrete Fourier spectral techniques because the latter cannot provide adequate information about non-linear relationships in the data points. Fourier spectral techniques linearly transform one set of data points into another providing a spectral estimation which contains no time sequential information.

FIG. 14 shows a schematic diagram of a non linear system analyser comprising the ADIC 160, as described herein. The input analogue signal 10 from the physical system to be analysed 162, for example a car engine, is input to the ADIC 160 where it is converted to a digitally equivalent representation, as previously described, for input to a digital processor. The processor 164 may be a Heuristic Processor, as described in U.S. Pat. No. 5,835,682, which is designed to estimate unknown results by an empirical self-learning approach based on the knowledge of prior results. The digital output from the ADIC is in the form of signed magnitudes, but for the purpose of subsequent computer processing this digital output should be expressed as a 2's complement code.

In a conventional nonlinear system analyser, the input signal, which is a continuous function of time, is sampled at regular intervals, using a conventional constant sampling rate analogue to digital converter. This results in a sequence of values called a time series. The processor 164 uses this time series to construct a trajectory evolving through multi-dimensional phase space whose axes are determined using a Singular Value Decomposition (SVD) calculation. The trajectory evolves with time over the surface of a geometrical object, called an attractor, which is a characteristic representation of the state of the physical system 162 from which the input signal 10 was generated. Each point on an attractor has an associated coordinate vector with sufficient elements to position it in a phase space with enough dimensions so that the trajectory does not intersect. Thus, a set of coordinate vectors is calculated describing points which uniquely represent a multi-dimensional geometrical object. Since attractors are characteristic of the physical system which generated them, these geometrical objects provide a means of comparing physical systems.

The comparison is achieved by calculating a multi-dimensional, nonlinear, predictive model of the trajectory which delineates the standard attractor. This mathematical model is constrained to predict the next sample in the time series from which it was calculated. In the prior art, when an input signal 10 is measured experimentally, and the time series deduced, the coordinates of its reconstructed trajectory are submitted to this model which, within its ability to generalise from data supplied by the standard, predicts the value of the next time series sample. The difference between the model's estimate and the actual measured value indicates the similarity of the two time series.

The following references describe non-linear system analysis in which a time series is processed to achieve a trajectory reconstruction; R. Jones, D. S. Broomhead, 1989, "Phase spaces from experimental time series", IEEE Conference on Electronic Circuits Theory and Design, Brighton, D. S. Broomhead and G. P. King, 1986, "Extracting qualitative dynamics from experimental data", Physica 20D, pp 217–236, D. S. Broomhead, R. Jones, 1989, "Time series analysis", Proc. Roy. Soc. London A 423, pp 103–121.

In known non linear systems analysers, a problem arises with the comparison described above due to the temporal dependence of the time series input to the processor 164. This is because the temporal evolution of the trajectory has been intimately tied to the original sample clock used to conventionally digitise the signal. Thus, if the signal has a waveform which repeats and the digitising clock is changed, or the waveform is dilated in time, the resulting reconstructed trajectory, although of similar "shape", will evolve through the phase space at a different rate and will not be temporally equivalent. Therefore, for input signals generated by the same physical system, having similar waveforms but having a different frequency (e.g. a car engine running at different speeds) the corresponding multi dimensional geometrical objects generated by the processor 164 will not be equivalent and the input signals will not be recognised as having arisen from the same waveform.

This problem is overcome by the apparatus of the invention, as shown in FIG. 14. In the ADIC 160, the input signal waveform 10 is sampled at irregular intervals and this results in a sequence of values (herein defined as a time sequence) each of which has an associated UP or DOWN flag depending on whether the amplitude of the input is increasing or decreasing respectively. This time sequence is input to the processor 164 and is used by the processor to compute the trajectory which evolves with time over the surface of the geometrical object. In this way, the temporal evolutionary disparity in conventional non linear systems analysers is removed. In removing the temporal dependence from the system, the geometrical objects computed from input signal arising from the same physical system, but with a time dilated waveform, will be equivalent independent of their frequency dependence.

What is claimed is:

1. An apparatus for converting an analogue input signal into a digital representation including;
   generation means for simultaneously generating at least two different threshold levels for comparison with the input signal,
   comparison means for comparing each of the threshold levels with the input signal and for generating a primary digital output signal to provide an indication that the input signal has crossed a threshold level, and
   timing means for determining any elapsed period of time between the input signal crossing a first threshold level and the input signal crossing a second threshold level at a later time and for providing a secondary digital output signal representing the elapsed period of time, wherein the secondary digital output signal and the corresponding primary digital output signal providing a digital representation of the analogue input signal.

2. The apparatus of claim 1, and further comprising means for receiving the primary digital output signal from the comparison means and for providing an UP/DOWN digital output signal to indicate in which direction, UP or DOWN, the input signal crossed the threshold level, whereby the secondary digital output signals and the associated UP/DOWN digital output signal constitute a digital representation of the analogue input signal.

3. The apparatus of claim 1, wherein the generation means include adjustment means for adjusting the threshold levels relative to the input signal in response to a threshold level crossing.

4. The apparatus of claim 3, wherein the adjustment means comprise means for adjusting the threshold levels themselves in response to a threshold level crossing.

5. The apparatus of claim 4 wherein the comparison means comprise two comparators, each receiving the input signal and a different one of two threshold levels, a threshold level greater than the input signal (UPPER) or threshold level less than the input signal (LOWER), forming an amplitude window about the current input signal, whereby if the input signal crosses one of the threshold levels the corresponding comparator generates a primary digital output signal to a subsequent logic stage for generating the UP/DOWN digital output signal.

6. The apparatus of claim 5, wherein the generation means comprise two digital to analogue converters, each for generating a different one of the two threshold levels, UPPER or LOWER, for input to the associated comparator, whereby the digital to analogue converters each receive a digital input determined by the direction of the UP/DOWN digital output signal generated by the preceding threshold level crossing.

7. The apparatus of claim 6, wherein the digital to analogue converters receive the digital inputs via counter means which serve to increasingly or decreasingly adjust the threshold levels accordingly in response to the UP/DOWN digital output signal generated by the preceding threshold level crossing.

8. The apparatus of claim 6 wherein the digital to analogue converters receive the digital inputs from a logic circuit which serves to increasingly or decreasingly adjust the threshold levels accordingly in response to the UP/DOWN digital output signal generated by the preceding threshold level crossing.

9. The apparatus of claim 3 wherein, following each threshold crossing, the threshold levels are substantially equal to $V_{REF}+\Delta V$ and $V_{REF}-\Delta V$, where $V_{REF}$ is the value of the analogue input signal as the threshold level crossing occurs and $\Delta V$ is a pre-set threshold voltage.

10. The apparatus of claim 3, and further comprising;
an absolute level crossing detection means, whereby the absolute-level crossing detection means provide an output each time the input analogue signal crosses the absolute level, and
means for adjusting the threshold levels relative to the analogue input signal in response to the absolute-level crossing detection output so as to correct for any cumulative errors in the threshold levels.

11. The apparatus of claim 10, wherein the absolute-level crossing detection means is a zero-crossing detection means.

12. The apparatus of claim 10, wherein the threshold levels themselves are adjusted in response to the absolute-level crossing detection output.

13. The apparatus of claim 1, wherein the comparison means comprise means for comparing each of the threshold levels with a signal derived from the input signal.

14. The apparatus of claim 13 comprising,
sample and hold means for sampling the analogue input signal to provide a sample input value,
and means of adjusting the sample input value held by the sample and hold means, thereby adjusting the threshold levels relative to the input signal, when the analogue input signal crosses one of the two threshold levels, $+\Delta V$ or $-\Delta V$.

15. The apparatus of claim 14, comprising;
a differential amplifier, receiving at one input the sample input value and receiving at the other input the evolving analogue input signal, the differential amplifier providing an output signal derived from the input signal, and
two comparators for comparing each of two, fixed threshold levels, $+\Delta V$, $-\Delta V$, with the differential amplifier output and for providing the primary digital output signal to provide an indication that the derived signal, and therefore the input signal, has crossed a threshold level.

16. The apparatus of claim 1, wherein the generation means comprise a flash analogue to digital converter for generating a plurality of fixed, digital threshold levels and for converting the analogue input signal into a binary coded digital output, and wherein the comparison means comprise logic circuitry for comparing the current binary coded digital output with the previous binary coded digital outputs to determine when and in which direction a threshold level crossing occurred.

17. The apparatus of claim 16, wherein the logic circuitry compares at least the two least significant bits of the previous binary coded digital outputs with at least the two least significant bits of the previous binary coded digital output to determine when and in which direction a threshold level crossing occurred.

18. The apparatus of claim 1, wherein the timing means comprises a timer counter for measuring the elapsed period of time which occurs between threshold level crossings.

19. The apparatus of claim 18, wherein the timer counter has a maximum count, and wherein the timing means further comprise means for determining when the maximum count has occurred.

20. The apparatus of claim 1, and further comprising means for initially normalising the analogue input signal such that any two or more analogue signals input to the converter have a common amplitude scaling.

21. The apparatus of claim 1, and also including an anti-aliasing filter which serves to limit the fastest rate of change of the input signal so that the time interval to which the fastest rate of change corresponds is greater than the time the converter takes to provide an output digital representation following a threshold level crossing.

22. A nonlinear system analyser for analysing an analogue input signal, said analyser comprising:
the apparatus of claim 1 for generating a digital representation of the input signal, and
processing means for receiving said digital representation and for generating a multi dimensional nonlinear predictive model, wherein the model is constrained such that it predicts the subsequent input signal.

23. The non linear system analyser of claim 22, further including means for comparing the predicted sample input signal with the measured input signal.

24. A method of converting an analogue input signal into a digital representation comprising the steps of;
(i) generating at least two threshold levels (UPPER, LOWER),
(ii) comparing the at least two threshold levels with the input signal,
(iii) generating a primary digital output signal to provide an indication that the input signal has crossed one of the threshold levels,
(iv) determining the elapsed period of time between the input signal crossing a first threshold level and the input signal crossing a second threshold level at a later time,
(v) producing a secondary digital output signal representing the elapsed period of time between the input signal crossing a first threshold level and the input signal crossing a second threshold level at a later time, and
(vi) providing a digital representation of the input signal from the secondary digital output signal and the corresponding primary digital output signal.

25. The method of claim 24, comprising the further steps of;

providing a single UP/DOWN digital output signal from the primary digital output signal to indicate in which direction, UP or DOWN, the input signal crossed the threshold level and providing a digital representation of the input signal comprising the secondary digital output signals and the associated UP/DOWN digital output signal.

26. The method of claim 25, and further comprising the step of expressing the digital representation as a 2's complement number.

27. The method of claim 24, and further comprising the step of adjusting the threshold levels relative to the input signal in response to a threshold level crossing.

28. The method of claim 24, comprising the step of comparing the input signal with two threshold levels.

29. The method of claim 28, comprising the step of adjusting the threshold levels themselves in response to the input signal crossing a threshold level so as to adjust the threshold levels relative to the input signal.

30. The method of claim 31, comprising the step of adjusting the derived signal in response to the derived signal crossing a threshold level so as to adjust the threshold levels relative to the derived signal.

31. The method of claim 24, comprising the step of comparing a signal derived from the input signal with the threshold levels.

32. An analogue to digital converter for converting an analogue input signal into a digital representation, said converter comprising:

generation means for simultaneously generating a threshold level greater than the current input signal and a threshold level less than the current input signal;

comparison means for comparing each of the threshold levels with the input signal and for generating a primary digital output signal to provide an indication that the input signal has crossed a threshold level;

adjustment means for adjusting the threshold levels relative to the input signal in response to a threshold level crossing so as to ensure that, following adjustment one threshold level is greater than the input signal at the point of threshold crossing and one threshold level is less than the input signal at the point of threshold crossing; and timing means for determining any elapsed period of time between the input signal crossing a first threshold level and the input signal crossing a second threshold level at a later time and for providing a secondary digital output signal representing the elapsed period of time, wherein the secondary digital output signal and the corresponding primary digital output signal provide a digital representation of the analogue input signal.

33. An apparatus for converting an analogue input signal into a digital representation, said apparatus comprising:

generation means for simultaneously generating a plurality of different threshold levels across the expected amplitude range of the input signal, for comparison with the input signal;

comparison means for comparing each of the threshold levels with the input signal and for generating a primary digital output signal to provide an indication that the input signal has crossed a threshold level; and timing means for determining the elapsed period of time between the input signal crossing a first threshold level and the input signal crossing a second threshold level at a later time and for providing a secondary digital output signal representing the elapsed period of time, wherein the secondary digital output signal and the corresponding primary digital output provide a digital representation of the analogue input signal.

* * * * *